(12) United States Patent
Kim et al.

(10) Patent No.: US 12,237,037 B2
(45) Date of Patent: Feb. 25, 2025

(54) DEVICE OF GENERATING REFERENCE VOLTAGES FOR MULTI-LEVEL SIGNALING AND MEMORY SYSTEM INCLUDING THE SAME

(71) Applicant: Samsung Electronics Co., Ltd., Suwon-si (KR)

(72) Inventors: Sang-Hoon Kim, Suwon-si (KR); Sungyong Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 174 days.

(21) Appl. No.: 18/151,784

(22) Filed: Jan. 9, 2023

(65) Prior Publication Data

US 2023/0386526 A1 Nov. 30, 2023

(30) Foreign Application Priority Data

May 30, 2022 (KR) ........................ 10-2022-0066303

(51) Int. Cl.
*G11C 7/00* (2006.01)
*G11C 5/14* (2006.01)
*H04L 25/49* (2006.01)

(52) U.S. Cl.
CPC .......... *G11C 5/147* (2013.01); *H04L 25/4917* (2013.01)

(58) Field of Classification Search
CPC ............ G11C 11/4093; G11C 11/4099; G11C 29/022; G11C 29/028; G11C 29/50008; G11C 11/4074; G11C 2207/2254; G11C 7/1057; G11C 11/4096; G11C 29/021; G11C 5/063; G11C 7/1051; G11C 11/4076; G11C 11/4082; G11C 11/4087; G11C 7/1084; G11C 5/147; G11C 7/02;
(Continued)

(56) References Cited

U.S. PATENT DOCUMENTS 7,230,449 B2 6/2007 Dreps et al.
7,436,246 B2 10/2008 Park
(Continued)

FOREIGN PATENT DOCUMENTS

KR 101935437 B1 4/2019

OTHER PUBLICATIONS

JEDEC, "GDDR7 VREF Mixing," AMD, JC42.1, Item 1860.30, Dec. 8, 2021.

*Primary Examiner* — Thong Q Le
(74) *Attorney, Agent, or Firm* — Harness, Dickey & Pierce, P.L.C.

(57) ABSTRACT

A reference voltage generation device includes a noise information generation circuit configured to generate power noise information based on a first power noise and a second power noise, the first power noise and the second power noise generated based on a first power and a second power supplied to a first electronic device and propagated from the first electronic device to a second electronic device through a communication line, and the first electronic device and the second electronic device configured to perform data communication using a multi-level signaling scheme. The device includes a reference voltage generation circuit configured to generate three or more reference voltages for the multi-level signaling scheme based on the power noise information, and the second electronic device is configured to use the three or more reference voltages.

20 Claims, 19 Drawing Sheets

(58) Field of Classification Search
CPC ......... G11C 5/145; G11C 16/30; G11C 16/26;
G11C 16/10; G11C 2029/5002; G11C
29/12; G11C 29/26; G11C 29/50; G11C
7/12; G11C 16/0483; G11C 5/146; G11C
7/14; G11C 11/4063; G11C 16/12; G11C
16/14; G11C 16/24; G11C 5/10; G11C
7/00; G11C 7/06; G11C 7/10; G11C
7/106; G11C 7/1087; G11C 8/10
See application file for complete search history.

(56) References Cited

U.S. PATENT DOCUMENTS

| | | | |
|---|---|---|---|
| 8,867,595 | B1 | 10/2014 | Luo et al. |
| 9,330,653 | B2 | 5/2016 | Yokota |
| 10,230,370 | B2 | 3/2019 | Guo et al. |
| 10,269,412 | B2 * | 4/2019 | Kim .................. G11C 11/4074 |
| 10,929,591 | B2 | 2/2021 | Raja et al. |

\* cited by examiner

FIG. 8

| TRIAL | RPU(ohm) | RPD(ohm) | VRT (from PS1/ from PS2) | PN INFO |
|---|---|---|---|---|
| 1 | 40 | Inf | x0.5/0 | - |
| 2 | 48 | 240 | x0.417/x0.083 | nds3 |
| 3 | 60 | 120 | x0.333/x0.167 | - |
| 4 | 80 | 80 | x0.25/x0.25 | nds2 |
| 5 | 120 | 60 | x0.167/x0.333 | - |
| 6 | 240 | 48 | x0.083/x0.417 | nds1 |
| 7 | Inf | 40 | 0/x0.5 | - |

| pntx | NCTL | RPU(ohm) | RPD(ohm) |
|---|---|---|---|
| 710-11 | NCTL1 | R1 | R2 |
| 710-12 | NCTL2 | R2 | R1 |
| 710-13 | NCTL1 | R1 | R2 |
| 710-14 | NCTL2 | R2 | R1 |

| pntx | NCTL | RPU(ohm) | RPD(ohm) |
|---|---|---|---|
| 710-13 | NCTL1 | R1 | R2 |
| 710-23 | NCTL2 | R2 | R1 |

FIG. 13B

| pntx | NCTL | RPU(ohm) | RPD(ohm) |
|---|---|---|---|
| 710-15 | NCTL1 | R1 | R2 |
| 710-26 | NCTL3 | R3 | R3 |
| 710-37 | NCTL2 | R2 | R1 |

DEVICE OF GENERATING REFERENCE VOLTAGES FOR MULTI-LEVEL SIGNALING AND MEMORY SYSTEM INCLUDING THE SAME

CROSS-REFERENCE TO RELATED APPLICATION

This application claims priority under 35 U.S.C. § 119 to Korean Patent Application No. 10-2022-0066303 filed on May 30, 2022, in the Korean Intellectual Property Office, the disclosures of which are incorporated by reference herein in their entireties.

BACKGROUND

Some example embodiments of the inventive concepts described herein relate to a semiconductor device, including a reference voltage generation device for multi-level signaling and/or a memory system including the reference voltage generation circuit.

A memory interface is used in a memory system for communication between a memory controller and a memory device. With the increasing demand on the memory interface having a high bandwidth, instead of a non-return-to-zero (NRZ) signaling scheme, a multi-level signaling (e.g., a pulse amplitude modulation (PAM) signaling) scheme is being used in a next-generation memory system including a GDDR6X or GDDR7 memory. For example, in the PAM4 signaling scheme where a 2-bit symbol is transmitted by using one of four signal levels, the throughput may be doubled while the bandwidth is maintained. However, compared to the NRZ signaling scheme, the PAM4 signaling scheme may provide a relatively small voltage margin. For this reason, the PAM4 signaling scheme may be vulnerable to the power noise caused by the powers supplied to the memory system.

SUMMARY

Some example embodiments of the inventive concepts provide a reference voltage generation device generating reference voltages capable of reducing an error when signals received in the multi-level signaling scheme are decoded.

Some example embodiments of the inventive concepts provide a memory system including the reference voltage generation device.

According to an example embodiment, a reference voltage generation device includes a noise information generation circuit configured to generate power noise information based on a first power noise and a second power noise, the first power noise and the second power noise generated based on a first power and a second power supplied to a first electronic device and propagated from the first electronic device to a second electronic device through a communication line, the first electronic device and the second electronic device configured to perform data communication using a multi-level signaling scheme. The device includes a reference voltage generation circuit configured to generate three or more reference voltages for the multi-level signaling scheme based on the power noise information, the second electronic device configured to use the three or more reference voltages.

According to an example embodiment, a memory system includes a memory controller; and a memory device connected with the memory controller through a plurality of channels, wherein the memory device includes local reference voltage generation circuits corresponding to the plurality of channels. Each of the local reference voltage generation circuits is configured to generate power noise information based on a first power noise and a second power noise, the first power noise and the second power noise generated based on a first power and a second power supplied to the memory controller and propagated from the memory controller to the memory device through a communication line; and generate three or more reference voltages for multi-level signaling based on the power noise information.

According to an example embodiment, a reference voltage generation device includes a noise information generation circuit including a power noise transmitter and a power noise receiver, the power noise transmitter included in a first electronic device, and the power noise receiver included in a second electronic device, and a reference voltage generation circuit configured to generate three or more reference voltages used in the second electronic device, the first electronic device and the second electronic device configured to perform data communication using a multi-level signaling scheme. The noise information generation circuit is configured to generate power noise information based on a first power noise and a second power noise, and the first power noise and the second power noise are generated based on a first power and a second power supplied to the first electronic device and propagated from the first electronic device to the second electronic device through a communication line, the reference voltage generation circuit is configured to generate the three or more reference voltages for the multi-level signaling scheme based on the power noise information, the power noise transmitter is configured to output the first and second power noises to a first terminal, the power noise receiver is configured to receive the first and second power noises through a second terminal, the second terminal connected with the first terminal through the communication line, and the multi-level signaling scheme is a pulse amplitude modulation level-4 (PAM4) scheme.

BRIEF DESCRIPTION OF THE FIGURES

The above and other objects and features of the inventive concepts will become apparent by describing in detail example embodiments thereof with reference to the accompanying drawings.

FIG. 8 is a diagram for describing power noise information of FIG. 7.

FIG. 13B is a diagram for describing a power noise transmitter included in a reference voltage generation device of FIG. 13A.

DETAILED DESCRIPTION

Below, some example embodiments of the inventive concepts will be described in detail and clearly to such an extent that one skilled in the art easily carries out the inventive concepts.

Figure 1:
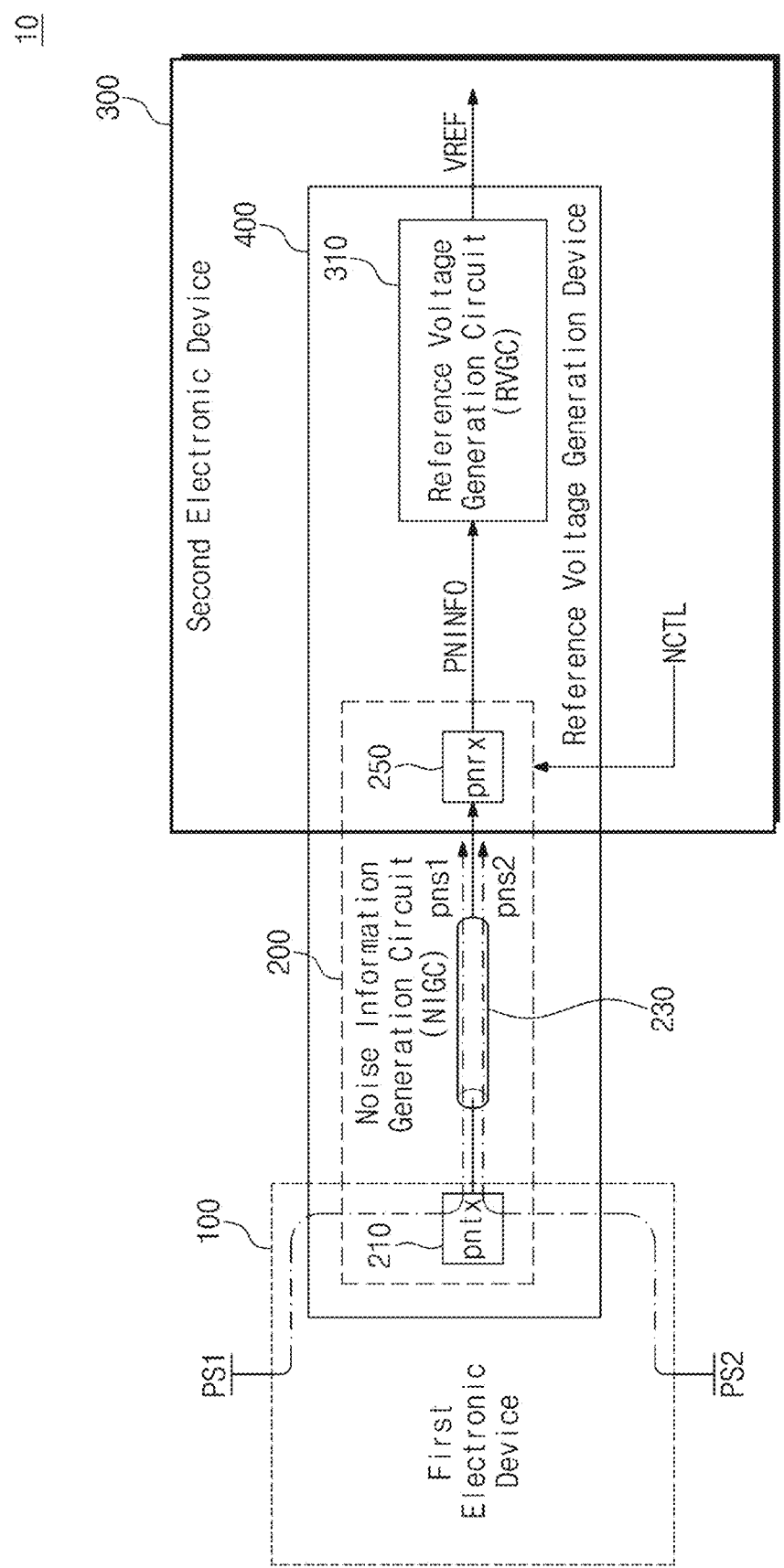
FIG. 1 is a block diagram illustrating a reference voltage generation device according to an example embodiment of the inventive concepts.

FIG. 1 is a block diagram illustrating a reference voltage generation device according to an example embodiment of the inventive concepts.

Referring to FIG. 1, a reference voltage generation device 400 may be used in an electronic system 10. The electronic system 10 may include a first electronic device 100 and a second electronic device 300 that perform data communication using the multi-level signaling scheme, and the reference voltage generation device 400 may generate a reference voltage VREF that is used in the second electronic device 300 among the first and second electronic devices 100 and 300.

In an example embodiment, the first electronic device 100 may be a memory controller, and the second electronic device 300 may be a memory device; however, the example embodiments are not limited thereto. In another example embodiment, the first electronic device 100 may be a host device, and the second electronic device 300 may be a memory system including the memory controller and the memory device. The memory device may include at least one of a nonvolatile memory device and a volatile memory device. An example embodiment in which the memory device is implemented with the volatile memory device will be described with reference to FIG. 6, and an example embodiment in which the memory device is implemented with the nonvolatile memory device will be described with reference to FIG. 18.

The first electronic device 100 and the second electronic device 300 may perform data communication using the multi-level signaling scheme. The data communication may allow the first electronic device 100 and the second electronic device 300 to transmit multi-level signals having signal levels of different magnitudes and respectively indicating multi-bit symbols; in some example embodiments, the throughput may be increased with the bandwidth of the data communication maintained. For example, a type of the data communication may correspond to pulse amplitude modulation (PAM) signaling. In some example embodiments, each symbol may be expressed by one of signal levels having different magnitudes. For example, in the case of the PAM4 signaling scheme, each symbol may be expressed by one of four signal levels having different magnitudes, and each signal level may indicate a 2-bit symbol.

In an example embodiment, when the first electronic device 100 and the second electronic device 300 perform the data communication, power noises that come from a first power PS1 and a second power PS2 supplied to the first electronic device 100 may be propagated to the second electronic device 300 through a communication line. The power noises may be added to the multi-level signals according to the data communication; when the signals are decoded, a decoding error may be caused by the power noises.

The reference voltage generation device 400 includes a noise information generation circuit 200 and a reference voltage generation circuit 310. The noise information generation circuit 200 includes a power noise transmitter 210, a communication line 230, and a power noise receiver 250.

The noise information generation circuit 200 generates power noise information PNINFO based on a first power noise pns1 and a second power noise pns2 that are generated based on the first power PS1 and the second power PS2 and are propagated from the first electronic device 100 to the second electronic device 300.

In an example embodiment, the power noise information PNINFO may be generated without the addition of separate pins/pads.

In an example embodiment, the noise information generation circuit 200 may generate the power noise information PNINFO based on both the first power PS1 and the second power PS2, not one of the first power PS1 and the second power PS2.

In an example embodiment, the first power PS1 and the second power PS2 may be supplied to the first electronic device 100 and may correspond to each other, and the first power PS1 may be greater than the second power PS2. For example, the first power PS1 and the second power PS2 may include powers VDD and VSS and may further include powers VDDQ and VSSQ. For example, one of the first power PS1 and the second power PS2 may include a ground voltage.

In an example embodiment, the first power noise pns1 may be a power noise that is generated based on the first power PS1 and is propagated to the second electronic device 300 through the communication line 230, and the second power noise pns2 may be a power noise that is generated based on the second power PS2 and is propagated to the second electronic device 300 through the communication line 230. The first power noise pns1 and the second power noise pns2 may be provided to the communication line 230 by the power noise transmitter 210 included in the first electronic device 100 and may be received from the communication line 230 by the power noise receiver 250 included in the second electronic device 300.

In an example embodiment, the communication line 230 may not be an electronic line that is additionally provided to implement (or carry out) the inventive concepts, but it may be one of electrical lines that are used to perform general operations of the first electronic device 100 and the second electronic device 300. For example, the communication line 230 may include at least one of a data line and a power line between the first electronic device 100 and the second electronic device 300.

In an example embodiment, the power noise transmitter 210 and the power noise receiver 250 may include a plurality of resistors. For example, the plurality of resistors may include variable resistors. Resistance values of the variable resistors may be adjusted based on a control signal NCTL that is generated by a control circuit (not illustrated) included in the second electronic device 300. In another example embodiment, the plurality of resistors may be set to have resistance values that are determined in advance.

The reference voltage generation circuit 310 generates three or more reference voltages VREF for the multi-level signaling based on the power noise information PNINFO.

In an example embodiment, the power noise information PNINFO may include one or more noise signals. The one or more noise signals may correspond to one or more of signal levels according to the data communication, and a noise signal corresponding to a specific signal level of the signal levels may be generated by adjusting the resistance values of the variable resistors. The noise signal will be described with reference to FIG. 8.

One or more of the reference voltages VREF may be generated by adding the noise signal to one or more of separate analog voltage signals that the reference voltage generation circuit 310 generates. The second electronic device 300 may include a plurality of memory devices, and the reference voltage generation circuit 310 may supply the reference voltages VREF for the plurality of memory devices. In some example embodiments, the first electronic device 100 may be referred to as an "external electronic device".

In an example embodiment, the reference voltage generation circuit 310 may supply the same reference voltages VREF to all the plurality of memory devices. In some example embodiments, the reference voltage generation circuit 310 may be referred to as a "global reference voltage generation circuit". In another example embodiment, the reference voltage generation circuit 310 may supply the reference voltages VREF to some of the plurality of memory devices. In some example embodiments, the reference voltage generation circuit 310 may be referred to as a "local reference voltage generation circuit", and the number of local reference voltage generation circuits may be 2 or more. The power noise information PNINFO will be described with reference to FIGS. 7 and 8.

In an example embodiment, in the case where the first electronic device 100 and the second electronic device 300 perform the data communication using the PAM4 signaling scheme, the reference voltages VREF may include a first reference voltage, a second reference voltage, and a third reference voltage, magnitudes of which increase sequentially. In some example embodiments, the reference voltages VREF may be used to decode multi-level signals that are transmitted from the first electronic device 100 to the second electronic device 300 in the process of performing the data communication. The reference voltages VREF will be described with reference to FIGS. 4 and 5. The reference voltage generation circuit 310 will be described with reference to FIGS. 9A, 9B, and 9C.

Through the above configuration, a reference voltage generation device according to an example embodiment of the inventive concepts may generate power noise information based on power noises that are generated based on both a first power and a second power supplied to the external electronic device and are propagated through a communication line. In the case of decoding multi-level signals, reference voltages may be generated based on the power noise information, and all the power noises that are based on both the first power and the second power may be removed based on the reference voltages. This may mean that the decoding error is inhibited or prevented.

Figure 2:
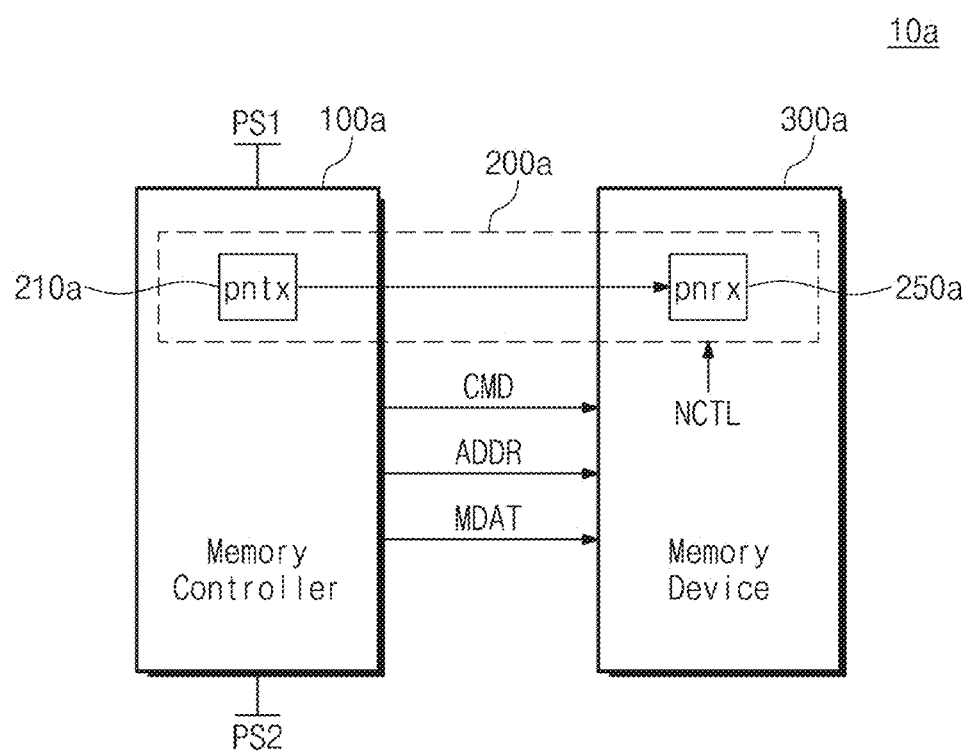
FIGS. 2 and 3 are block diagrams illustrating an example embodiment of a memory system using a reference voltage generation device of FIG. 1.
Figure 3:
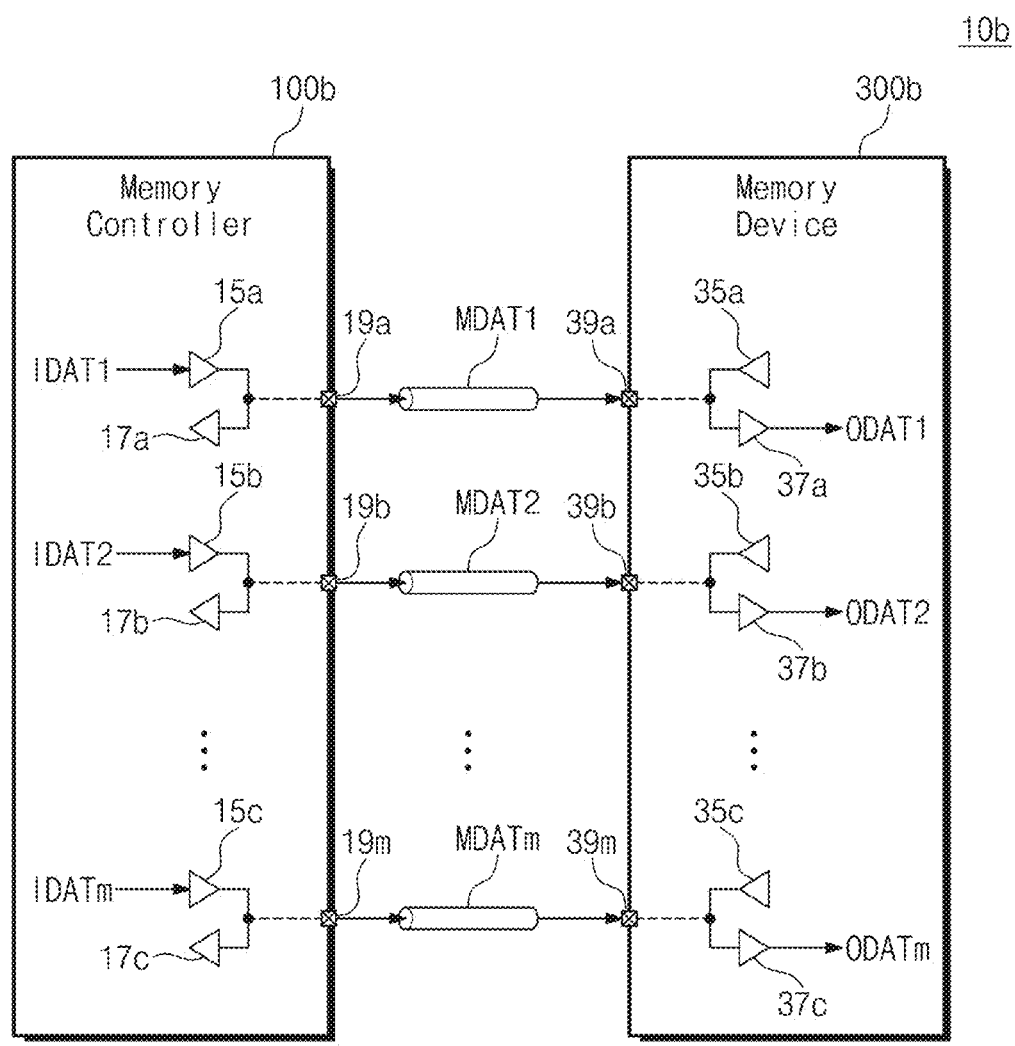

FIGS. 2 and 3 are block diagrams illustrating an example embodiment of a memory system using a reference voltage generation device of FIG. 1.

Referring to FIGS. 1 and 2, a memory system 10a includes a memory controller 100a and a memory device 300a.

The memory controller 100a may overall control an operation of the memory device 300a. For example, the memory system 10a may include a plurality of signal lines, and may control the operation of the memory device 300a by providing the memory device 300a with commands CMD, addressees ADDR, and data MDAT through the plurality of signal lines.

The memory controller 100a may correspond to the first electronic device 100 of FIG. 1, the memory device 300a may correspond to the second electronic device 300 of FIG. 1, and the memory controller 100a and the memory device 300a may exchange the data MDAT in the multi-level signaling scheme described with reference to FIG. 1. For example, the memory device 300a may receive multi-level data MDAT from the memory controller 100a and may transmit the multi-level data MDAT to the memory controller 100a.

The memory system 10a may further include a reference voltage generation device 200a including a power noise transmitter 210a and a power noise receiver 250a. The power noise transmitter 210a may be included in the memory controller 100a, and the power noise receiver 250a may be included in the memory device 300a.

The reference voltage generation device 200a may generate power noise information based on power noises that are propagated to the memory device 300a and may generate reference voltages used to decode the multi-level data MDAT. The power noises may be generated based on both the first power PS1 and the second power PS2 supplied to the memory controller 100a. The power noise transmitter 210a and the power noise receiver 250a may include a plurality of resistors, and the plurality of resistors may be variable resistors whose resistance values are adjusted based on the control signal NCTL. The control signal NCTL may be generated by a control circuit (not illustrated) included in the memory device 300a.

Referring to FIGS. 1, 2, and 3, a memory system 10b includes a memory controller 100b and a memory device 300b.

The memory controller 100b may include a plurality of transmission drivers 15a, 15b, and 15c, a plurality of reception drivers 17a, 17b, and 17c, and a plurality of input/output pads 19a, 19b, ..., 19m, and the memory device 300b may include a plurality of transmission drivers 35b, and 35c, a plurality of reception drivers 37a, 37b, and 37c, and a plurality of input/output pads 39a, 39b, ..., 39m.

Each of the plurality of transmission drivers 15a, 15b, and 15c may generate a multi-level signal, and each of the plurality of reception drivers 17a, 17b, and 17c may receive the multi-level signal. The memory controller 100b and the memory device 300b may be connected with each other through plurality of input/output pads 19a, 19b, ..., 19m and 39a, 39b, ..., 39m, and may exchange multi-level data MDAT1, MDAT2, ..., MDATm. For example, the memory controller 100b may encode input data IDAT1, IDAT2, ..., IDATm by using the plurality of transmission drivers 15a, 15b, and 15c and may transmit the multi-level data MDAT1, MDAT2, ..., MDATm to the memory device 300b as an encoding result; the memory device 300b may decode the multi-level data MDAT1, MDAT2, ..., MDATm by using the plurality of reception drivers 37a, 37b, and 37c and may receive output data ODAT1, ODAT2, ..., ODATm as a decoding result.

In an example embodiment, when the memory controller 100b transmits the multi-level data MDAT1, MDAT2, MDATm to the memory device 300b, the plurality of reception drivers 37a, 37b, and 37c may receive the multi-level data MDAT1, MDAT2, ..., MDATm, may receive the reference voltages, and may decode the multi-level data MDAT1, MDAT2, ..., MDATm based on a result of comparing the multi-level data MDAT1, MDAT2, ..., MDATm and the reference voltages.

Figure 4:
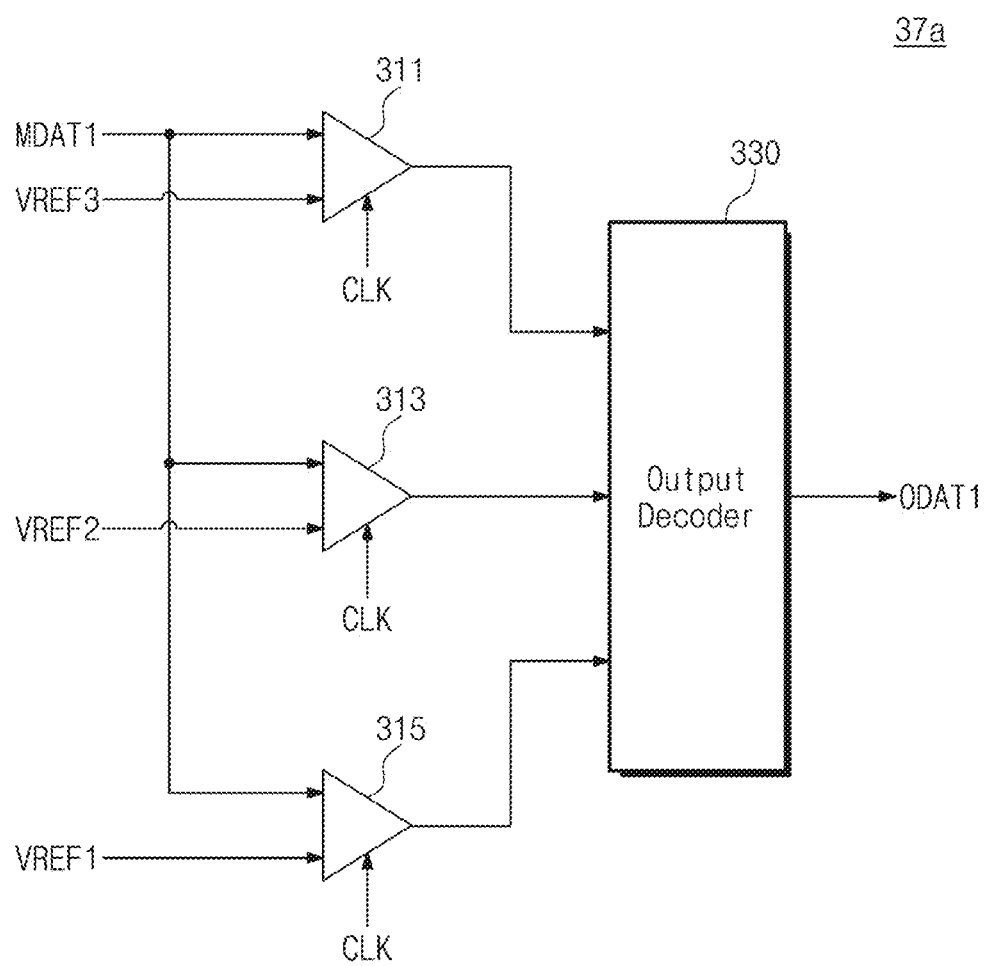
FIG. 4 is a block diagram illustrating an example embodiment of a reception driver of FIG. 3.
Figure 5:
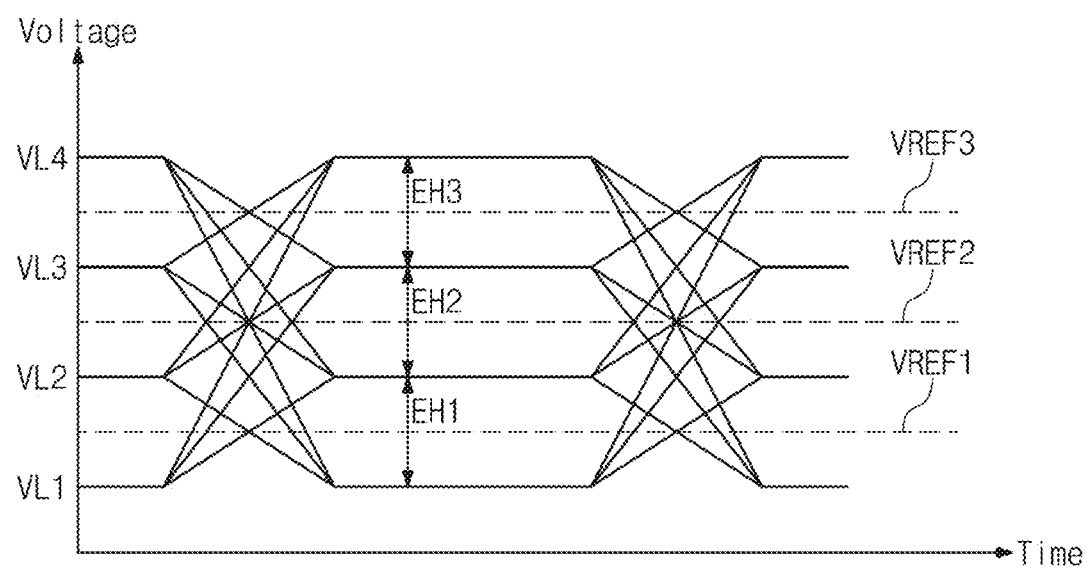
FIG. 5 is a diagram illustrating an eye diagram associated with signals used in multi-level signaling.

FIG. 4 is a block diagram illustrating an example embodiment of a reception driver of FIG. 3. FIG. 5 is a diagram illustrating an eye diagram associated with signals used in multi-level signaling.

Referring to FIGS. 3 and 4, the reception driver 37a may include reception buffers 311, 313, and 315 and an output decoder 330. Configurations of the remaining reception drivers 17a to 17c, 37b, and 37c illustrated in FIG. 3 may be similar to the configuration of the reception driver 37a.

The reception buffers 311, 313, and 315 may receive the multi-level data MDAT1 and a clock signal CLK. The reception buffer 311 may further receive a reference voltage VREF3, the reception buffer 313 may further receive a reference voltage VREF2, and the reception buffer 315 may further receive a reference voltage VREF1.

The reception buffers 311, 313, and 315 may compare a voltage level of the multi-level data MDAT1 with voltage levels of corresponding reference voltages based on the clock signal CLK toggling every unit time period and may output comparison results to the output decoder 330, and the output decoder 330 may output a symbol, which is obtained by decoding the multi-level data MDAT1 based on the comparison results, as output data ODAT1.

Signal levels VL1, VL2, VL3, and VL4 and the reference voltages VREF1, VREF2, and VREF3 are illustrated in FIG. 5. Referring to FIG. 5, the signal levels VL1, VL2, VL3, and VL4 may indicate signal levels that the multi-level data MDAT1 is capable of having in the PAM4 signaling-based data communication, and the reference voltages VREF1, VREF2, and VREF3 that have preset voltage levels may be used in the process of decoding the multi-level data MDAT1. For example, the reference voltage VREF1 may have a voltage level between the signal levels VL2 and VL1, the reference voltage VREF2 may have a voltage level between the signal levels VL3 and VL2, and the reference voltage VREF3 may have a voltage level between the signal levels VL4 and VL3. As illustrated in FIG. 5, in the case of performing the data communication using the PAM4 signaling scheme, eye heights (or intervals) EH1, EH2, and EH3 between adjacent signal levels of the signal levels VL1 to VL4 may be reduced by "⅓" or less of an NRZ eye height and may be vulnerable to the power noise.

Figure 6:
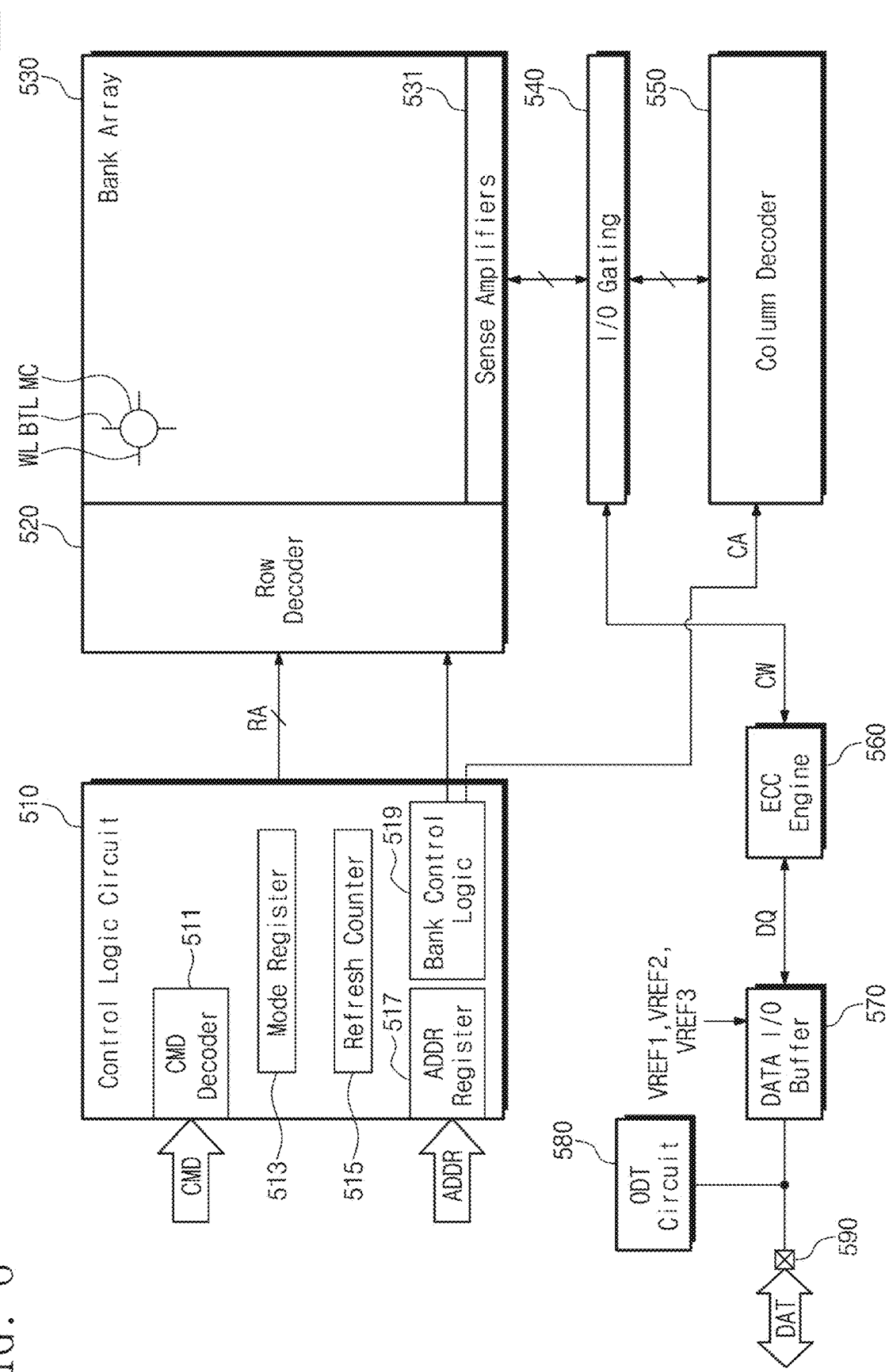
FIG. 6 is a block diagram illustrating an example of a memory device of FIG. 2 or 3.

FIG. 6 is a block diagram illustrating an example embodiment of a memory device of FIG. 2 or 3.

Referring to FIGS. 2, 3, and 6, a memory device 500 may include a control logic circuit 510, a row decoder 520, a bank array 530, a sense amplifier unit 531, an input/output gating circuit 540, a column decoder 550, an ECC engine 560, a data input/output buffer 570, and an on-die termination (ODT) circuit 580. The control logic circuit 510 may include a command decoder 511, a mode register 513, a refresh counter 515, an address register 517, and bank control logic 519. For example, the memory device 500 may be a volatile memory device. In detail, the memory device 500 may be a DRAM.

The bank array 530 may include a plurality of bank arrays. The row decoder 520 may include a plurality of bank row decoders respectively connected with the plurality of bank arrays, the column decoder 550 may include a plurality of bank column decoders respectively connected with the plurality of bank arrays, and the sense amplifier unit 531 may include a plurality of bank sense amplifiers respectively connected with the plurality of bank arrays. The plurality of bank arrays, the plurality of bank row decoders, the plurality of bank column decoders, and the plurality of bank sense amplifiers may constitute a plurality of banks. Each of the plurality of bank arrays may include a plurality of memory cells MC that are formed at intersections of a plurality of word lines WL and a plurality of bit lines BTL.

The address register 517 may receive the address ADDR including a bank address, a row address, and a column address from the memory controller. The address register 517 may provide the bank address to the bank control logic 519, may provide the row address to the row decoder 520, and may provide the column address to the column decoder 550.

The bank control logic 519 may generate a bank control signal in response to the bank address. A bank row decoder and a bank column decoder that correspond to the bank address may be activated based on the bank control signal.

The refresh counter 515 may generate a refresh row address that sequentially increases or decreases under control of the control logic circuit 510. The bank column decoder activated from the plurality of bank column decoders may activate sense amplifiers, which correspond to the bank address, the row address, and the column address and are included in the sense amplifier unit 531, by using the input/output gating circuit 540.

A codeword CW read from one of the plurality of bank arrays may be sensed by sense amplifiers corresponding to the one bank array, the ECC engine 560 may perform ECC decoding on the sensed codeword CW, and a DQ signal may be provided to the memory controller through the data input/output buffer 570 as an ECC decoding result. Data DAT that are transmitted from an input/output pad 590 to the data input/output buffer 570 may be the multi-level data described with reference to FIGS. 1 and 4. The data input/output buffer 570 may include reception drivers for encoding the multi-level data and may receive the reference voltages VREF1, VREF2, and VREF3 for the encoding.

The data DAT to be written in one of the plurality of bank arrays may be provided to the ECC engine 560, the ECC engine 560 may generate parity bits based on the data DAT and may provide a codeword including the data DAT and the parity bits to the input/output gating circuit 540, and the input/output gating circuit 540 may write the codeword in the one bank array.

The control logic circuit 510 may control the operation of the memory device 500. For example, the control logic circuit 510 may generate control signals such that the memory device 500 performs a write operation or a read operation. The control logic circuit 510 may include the command decoder 511 that decodes the command CMD received from the memory controller and the mode register 513 for setting an operation mode of the memory device 500. For example, the command decoder 511 may decode a write enable signal, a row address strobe signal, a column address strobe signal, a chip select signal, etc., and may generate the control signals corresponding to the command CMD.

The ODT circuit 580 may be connected with the data input/output pad 590 and the data input/output buffer 570 and may perform impedance matching.

Figure 7:
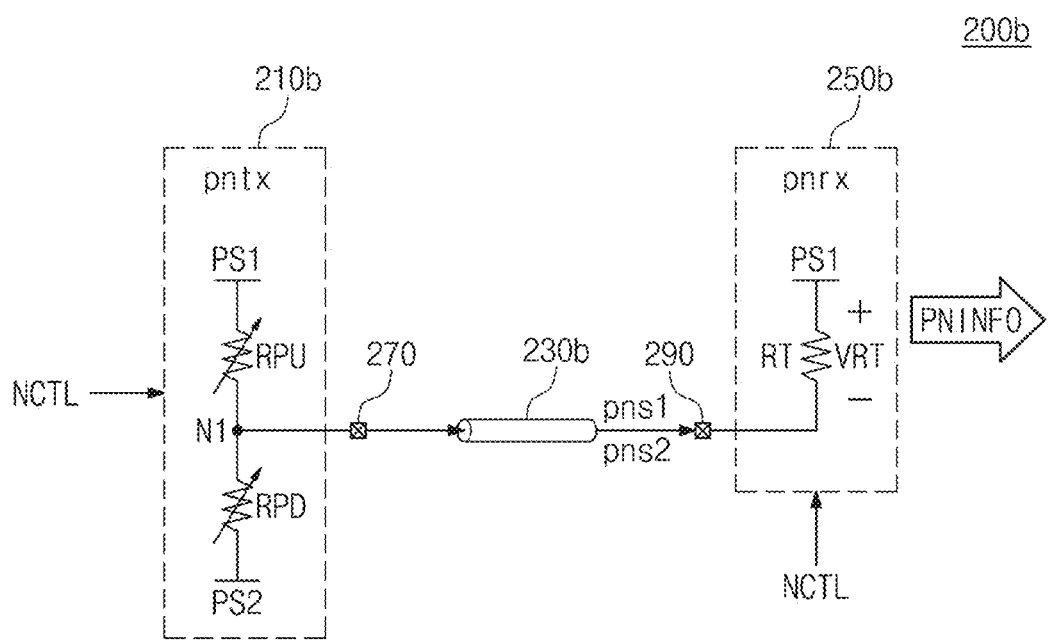
FIG. 7 is a circuit diagram illustrating an example embodiment of a noise information generation circuit of FIG. 1.

FIG. 7 is a circuit diagram illustrating an example embodiment of a noise information generation circuit of FIG. 1.

Referring to FIGS. 1 and 7, a noise information generation circuit 200b may include a power noise transmitter 210b, a communication line 230b, and a power noise receiver 250b.

The power noise transmitter 210b may be included in the first electronic device 100, and the power noise receiver 250b may be included in the second electronic device 300.

The power noise transmitter 210b may output, to a first terminal 270, the first power noise pns1 and the second power noise pns2 that are generated based on the first power PS1 and the second power PS2 supplied to the first electronic device 100 and are propagated from the first electronic device 100 to the second electronic device 300 through the communication line 230b. The power noise receiver 250b may receive the first and second power noises pns1 and pns2 through a second terminal 290 connected with the first terminal 270 through the communication line 230b.

In an example embodiment, the power noise transmitter 210b may be electrically connected with the first power PS1, the second power PS2, and the first terminal 270, and the power noise receiver 250b may be electrically connected with the first power PS1 and the second terminal 290.

The power noise transmitter 210b may include a resistor RPU and a resistor RPD connected in series between the first power PS1 and the second power PS2, and the power noise receiver 250b may include a resistor RT electrically connected between the first power PS1 and the second terminal 290.

In an example embodiment, the first terminal 270 may be connected with a first node N1, and the first node N1 may be a node between the resistor RPU and the resistor RPD.

In an example embodiment, resistance values of the resistor RPU and the resistor RPD may be adjusted based on the control signal NCTL or may be determined in advance. The power noise information PNINFO may be generated based on the resistor RPU, the resistor RPD, and the resistor RT. The power noise information PNINFO may include a noise signal corresponding to one or more of signal levels according to the data communication between the first electronic device 100 and the second electronic device 300.

FIG. 8 is a diagram for describing power noise information of FIG. 7. Various trials for adjusting resistance values of the resistor RPU and the resistor RPD necessary to generate the power noise information PNINFO are illustrated in FIG. 8.

Referring to FIGS. 7 and 8, when the resistor RPU has a resistance value of 40 ohm and the resistor RPD has a resistance value of "Inf" (e.g., refer to TRIAL 1), the power noise receiver 250b may output the power noise information PNINFO including a noise signal. For example, the power noise information PNINFO may be generated based on a result of measuring a voltage across the resistor RT. In some example embodiments, the power noise information PNINFO may include the noise signal in which a ratio of the first power noise pns1 propagated based on the first power PS1 and the second power noise pns2 propagated based on the second power PS2 is 0.5:0 (e.g., in which only a component of the first power noise pns1 is included).

When the resistor RPU has a resistance value of 48 ohm and the resistor RPD has a resistance value of 240 ohm (e.g., refer to TRIAL 2), the power noise receiver 250b may output the power noise information PNINFO. In some example embodiments, the power noise information PNINFO may include the noise signal in which a ratio of the first power noise pns1 and the second power noise pns2 is 0.417:0.083 (e.g., the noise signal including both the first power noise component and the second power noise component at a given ratio).

When the resistor RPU has a resistance value of 60 ohm and the resistor RPD has a resistance value of 120 ohm (e.g., refer to TRIAL 3), the power noise receiver 250b may output the power noise information PNINFO. In some example embodiments, the power noise information PNINFO may include the noise signal in which a ratio of the first power noise pns1 and the second power noise pns2 is 0.333:0.167.

As in the above description, the remaining trials TRIAL4, TRIAL5, TRIAL6, and TRIAL7 may be performed by adjusting resistance values of the resistor RPU and the resistor RPD, and thus, the power noise information PNINFO including a noise signal corresponding to each trial may be generated.

In an example embodiment, the power noise information PNINFO may be generated by performing the trials TRIAL2, TRIAL4, and TRIAL6. In some example embodiments, the power noise information PNINFO may include noise signals nds1, nds2, and nds3.

In an example embodiment, the first noise signal nds1 may correspond to the second signal level VL2 of the signal levels VL1, VL2, VL3, and VL4 described with reference to FIG. 5. The second noise signal nds2 may correspond to the third signal level VL3 of the signal levels VL1, VL2, VL3, and VL4. The third noise signal nds3 may correspond to the fourth signal level VL4 of the signal levels VL1, VL2, VL3, and VL4.

Figure 9A:
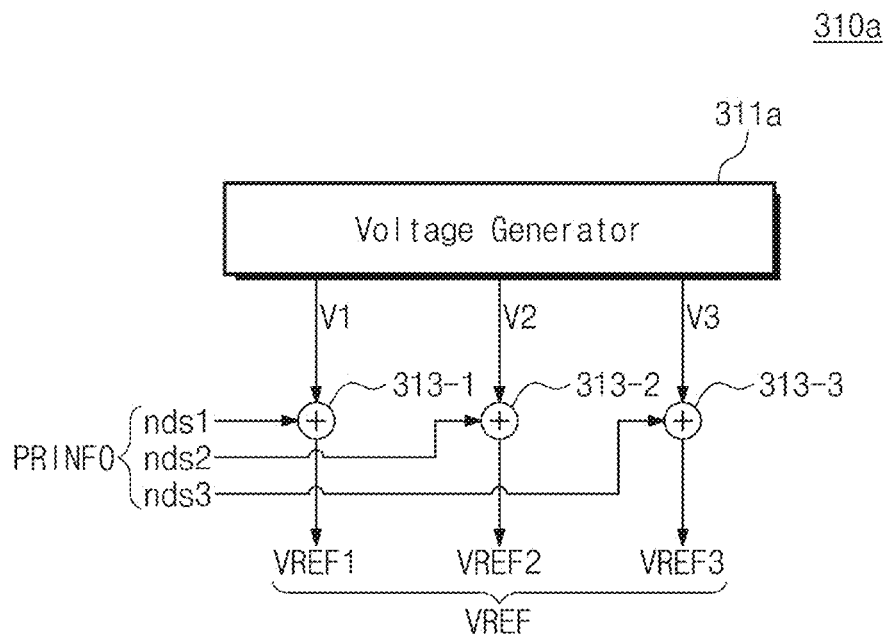
FIGS. 9A, 9B, and 9C are block diagrams illustrating example embodiments of a reference voltage generation circuit of FIG. 1.
Figure 9B:
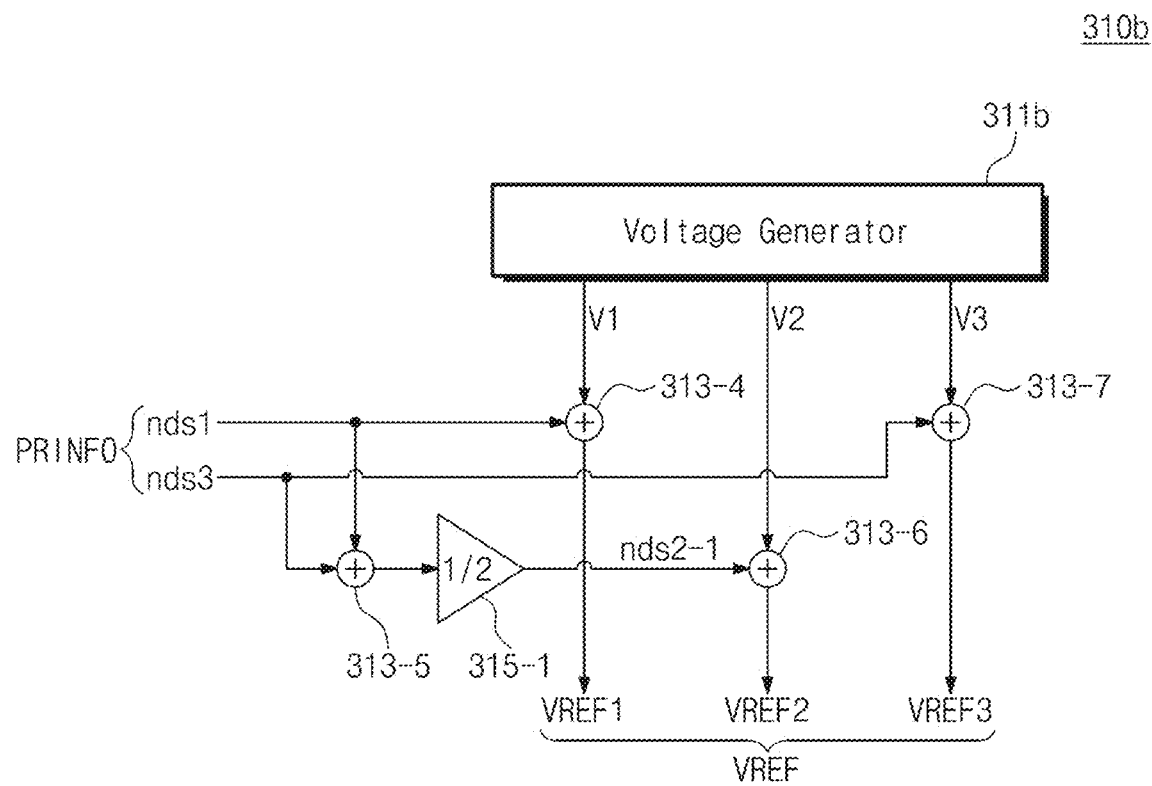
Figure 9C:
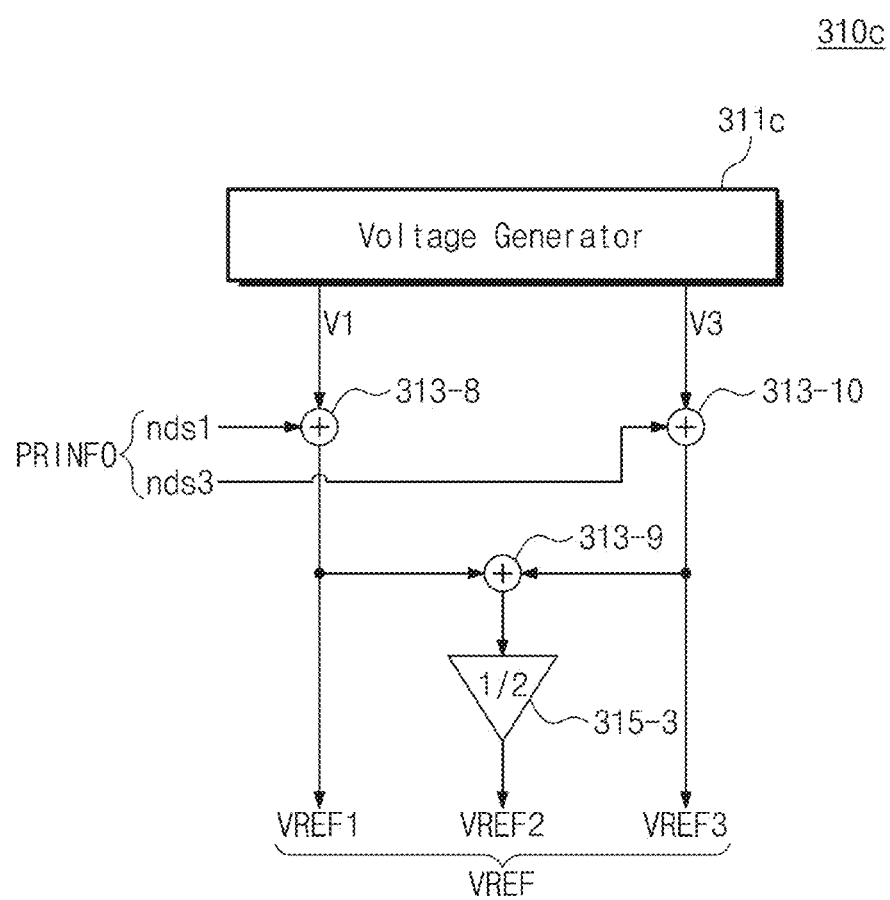

FIGS. 9A, 9B, and 9C are block diagrams illustrating example embodiments of a reference voltage generation circuit of FIG. 1.

Referring to FIGS. 8 and 9A, a reference voltage generation circuit 310a may generate three or more reference voltages VREF for multi-level signaling based on the power noise information PNINFO. For example, the reference voltage generation circuit 310a may generate three reference voltages VREF1, VREF2, and VREF3 for PAM4 signaling. The reference voltage generation circuit 310a may include a voltage generator 311a and adders 313-1, 313-2, and 313-3. The power noise information PNINFO may include the first to third noise signals nds1 to nds3.

The voltage generator 311a may output a first voltage signal V1, a second voltage signal V2, and a third voltage signal V3. The first adder 313-1 may receive the first voltage signal V1 and the first noise signal nds1 and may output a value obtained by adding the first voltage signal V1 and the first noise signal nds1 as the first reference voltage VREF1. The second adder 313-2 may receive the second voltage signal V2 and the second noise signal nds2 and may output a value obtained by adding the second voltage signal V2 and the second noise signal nds2 as the second reference voltage VREF2. The third adder 313-3 may receive the third voltage signal V3 and the third noise signal nds3 and may output a value obtained by adding the third voltage signal V3 and the third noise signal nds3 as the third reference voltage VREF3.

Referring to FIGS. 8 and 9B, a reference voltage generation circuit 310b may generate the three reference voltages VREF1, VREF2, and VREF3 for PAM4 signaling based on the power noise information PNINFO. The reference voltage generation circuit 310b may include a voltage generator 311b, adders 313-4, 313-5, 313-6, and 313-7, and a first multiplier 315-1. The power noise information PNINFO may include the first noise signal nds1 and the third noise signal nds3.

The voltage generator 311b may output the first voltage signal V1, the second voltage signal V2, and the third voltage signal V3. The fourth adder 313-4 may receive the first voltage signal V1 and the first noise signal nds1 and may output a value obtained by adding the first voltage signal V1 and the first noise signal nds1 as the first reference voltage VREF1. The fifth adder 313-5 may receive the first noise signal nds1 and the third noise signal nds3 and may output a value obtained by adding the first noise signal nds1 and the third noise signal nds3. The first multiplier 315-1 may output a value obtained by multiplying a given ratio (e.g., "½") and a value output from the fifth adder 313-5 together. The sixth adder 313-6 may output a value obtained by adding the second voltage signal V2 and a value output from the first multiplier 315-1 as the second reference voltage VREF2. The seventh adder 313-7 may receive the third voltage signal V3 and the third noise signal nds3 and may output a value obtained by adding the third voltage signal V3 and the third noise signal nds3 as the third reference voltage VREF3.

Referring to FIGS. 8 and 9C, a reference voltage generation circuit 310c may generate the three reference voltages VREF1, VREF2, and VREF3 for PAM4 signaling based on the power noise information PNINFO. The reference voltage generation circuit 310c may include a voltage generator 311c, adders 313-8, 313-9, and 313-10, and a second multiplier 315-3. The power noise information PNINFO may include the first noise signal nds1 and the third noise signal nds3.

The voltage generator 311c may output the first voltage signal V1 and the third voltage signal V3. The eighth adder 313-8 may receive the first voltage signal V1 and the first noise signal nds1 and may output a value obtained by adding the first voltage signal V1 and the first noise signal nds1 as the first reference voltage VREF1. The tenth adder 313-10 may receive the third voltage signal V3 and the third noise signal nds3 and may output a value obtained by adding the third voltage signal V3 and the third noise signal nds3 as the third reference voltage VREF3. The ninth adder 313-9 may receive the first reference voltage VREF1 and the third reference voltage VREF3 and may output a value obtained by adding the first reference voltage VREF1 and the third reference voltage VREF3, and the second multiplier 315-3 may output a value obtained by multiplying a given ratio (e.g., "½") and a value output from the ninth adder 313-9 as the second reference voltage VREF2.

Figure 10:
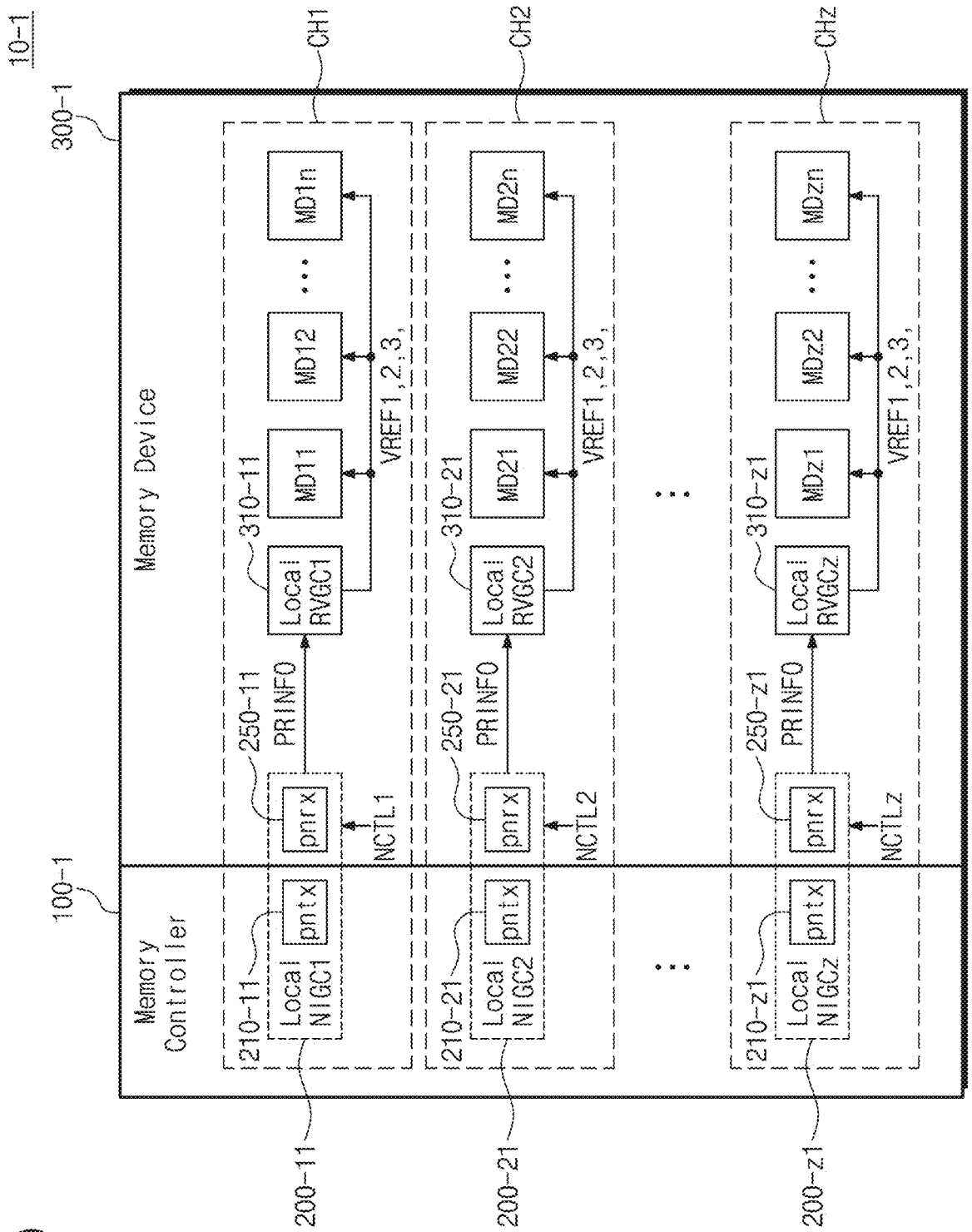
FIG. 10 is a block diagram illustrating a memory system including a reference voltage generation device according to an example embodiment of the inventive concepts.

FIG. 10 is a block diagram illustrating a memory system including a reference voltage generation device according to an example embodiment of the inventive concepts.

Referring to FIG. 10, a memory system 10-1 may include a memory controller 100-1 and a memory device 300-1. The memory controller 100-1 may overall control an operation of the memory device 300-1, and the memory device 300-1 may include a plurality of sub-memory devices MD11, MD12, ..., MD1n, MD21, MD22, ..., MD2n, and MDz1, MDz2, ..., MDzn (n and z being an integer of 3 or more). The plurality of sub-memory devices MD11, MD12, ..., MD1n, MD21, MD22, ..., MD2n, and MDz1, MDz2, ..., MDzn may constitute the plurality of banks described with reference to FIG. 6. For example, the sub-memory devices MD11 to MD1n may constitute a first bank, the sub-memory devices MD21 to MD2n may constitute a second bank, and the sub-memory devices MDz1 to MDzn may constitute a z-th bank. The first bank, the second bank, and the z-th bank may respectively correspond to a plurality of channels CH1, CH2, ..., CHz.

In an example embodiment, the memory device 300-1 may be connected with the memory controller 100-1 through the plurality of channels CH1, CH2, ..., CHz.

The memory device 300-1 may further include local reference voltage generation circuits 310-11, 310-21, ..., 310-z1 respectively corresponding to the plurality of channels CH1, CH2, ..., CHz. Each of the local reference voltage generation circuits 310-11, 310-21, ..., 310-z1 may generate the power noise information PRINFO based on a first power noise and a second power noise that are generated based on a first power and a second power supplied to the memory controller 100-1 and are propagated from the memory controller 100-1 to the memory device 300-1 through a communication line, and may generate three or more reference voltages for multi-level signaling, for example, the three reference voltages VREF1, VREF2, and VREF3 based on the power noise information PRINFO.

In an example embodiment, the reference voltage generation device, e.g., 400 in FIGS. 1 and 200a in FIG. 2, described with reference to FIGS. 1 and 2 may be implemented in the memory controller 100-1 and the memory device 300-1 for each of the channels CH1, CH2, ..., CHz. For example, a first noise information generation circuit 200-11 that includes a power noise transmitter 210-11 and a power noise receiver 250-11 may be implemented to correspond to the first channel CH1; a second noise information generation circuit 200-21 that includes a power noise transmitter 210-21 and a power noise receiver 250-21 may be implemented to correspond to the second channel CH2; a z-th noise information generation circuit 200-z1 that includes a power noise transmitter 210-z1 and a power noise receiver 250-z1 may be implemented to correspond to the z-th channel CHz.

In an example embodiment, the first local reference voltage generation circuit 310-11 may supply the reference voltages VREF1, VREF2, and VREF3 to the sub-memory devices MD11, MD12, ..., MD1n corresponding to the first channel CH1; the second local reference voltage generation circuit 310-21 may supply the reference voltages VREF1, VREF2, and VREF3 to the sub-memory devices MD21, MD22, ..., MD2n corresponding to the second channel CH2; the z-th local reference voltage generation circuit 310-z1 may supply the reference voltages VREF1, VREF2, and VREF3 to the sub-memory devices MDz1, MDz2, ..., MDzn corresponding to the z-th channel CHz.

In an example embodiment, the first to z-th noise information generation circuits 200-11, 200-21, ..., 200-z1 may operate based on control signals NCTL1, NCTL2, ..., NCTLz respectively corresponding thereto.

Figures 11A, 11B:
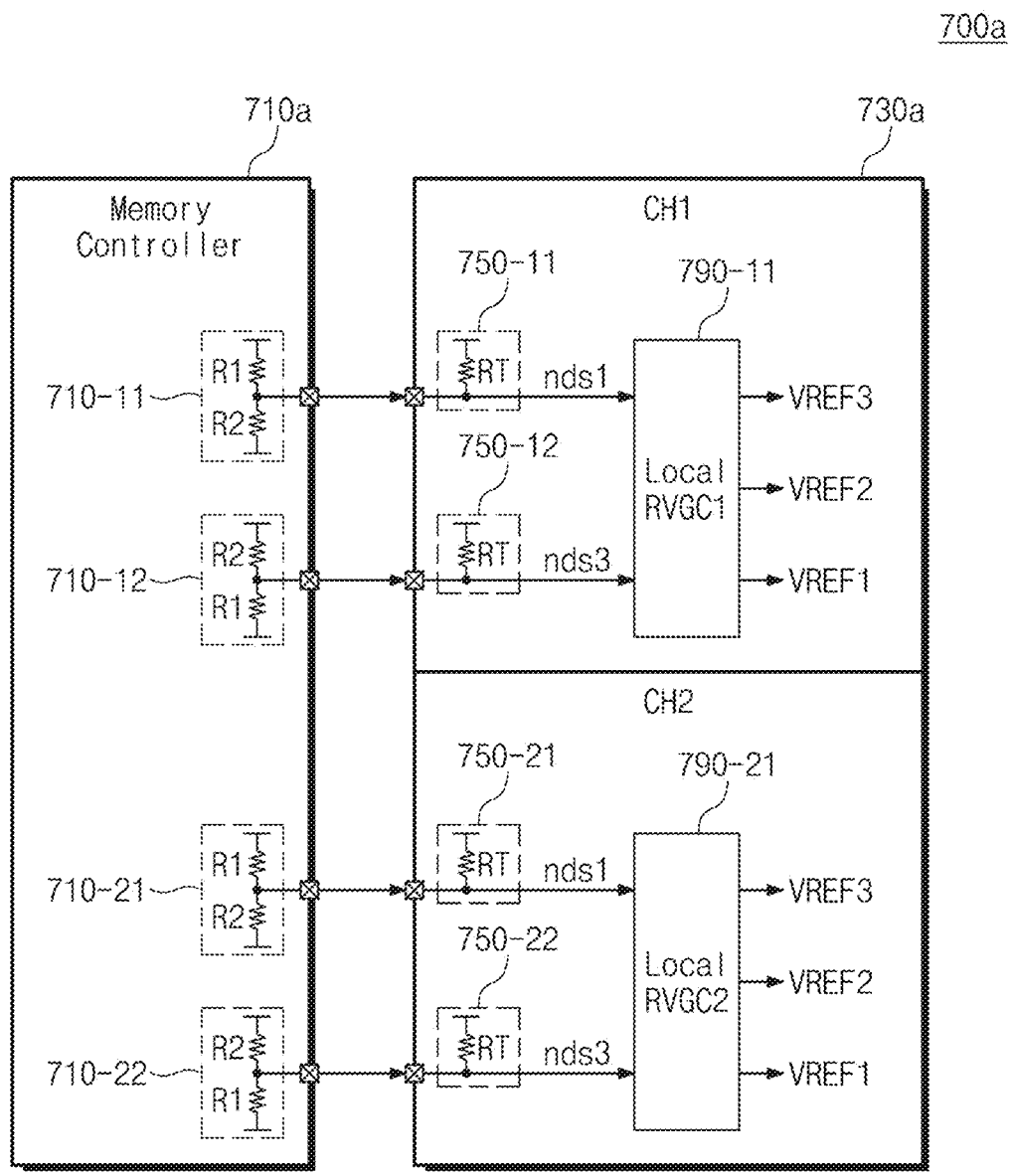
FIG. 11A is a block diagram illustrating an example embodiment of a memory system of FIG. 10.
FIG. 11B is a diagram for describing a power noise transmitter included in a reference voltage generation device of FIG. 11A.

FIG. 11A is a block diagram illustrating an example embodiment of a memory system of FIG. 10. FIG. 11B is a diagram for describing a power noise transmitter included in a reference voltage generation device of FIG. 11A.

Referring to FIGS. 10 and 11A, a memory system 700a may correspond to the memory system 10-1 of FIG. 10. The memory system 700a may include a memory controller 710a and a memory device 730a, the memory controller 710a may correspond to the memory controller 100-1 of FIG. 10, and the memory device 730a may correspond to the memory device 300-1 of FIG. 10.

The memory system 700*a* may include a plurality of channels and local reference voltage generation circuits corresponding to the plurality of channels. For example, the plurality of channels may include the first channel CH1 and the second channel CH2, and the local reference voltage generation circuits may include a first local reference voltage generation circuit 790-11 and a second local reference voltage generation circuit 790-21.

The first local reference voltage generation circuit 790-11 may receive (1-1)-th power noise information that corresponds to the first channel CH1 and includes the first noise signal nds1 from a (1-1)-th noise information generation circuit including a power noise transmitter 710-11 and a power noise receiver 750-11. The first local reference voltage generation circuit 790-11 may correspond to the first channel CH1 and may receive (1-2)-th power noise information including the third noise signal nds3 from a (1-2)-th noise information generation circuit including a power noise transmitter 710-12 and a power noise receiver 750-12.

The second local reference voltage generation circuit 790-21 may correspond to the second channel CH2 and may receive (2-1)-th power noise information including the first noise signal nds1 from a (2-1)-th noise information generation circuit including a power noise transmitter 710-21 and a power noise receiver 750-21. The second local reference voltage generation circuit 790-21 may correspond to the second channel CH2 and may receive (2-2)-th power noise information including the third noise signal nds3 from a (2-2)-th noise information generation circuit including a power noise transmitter 710-22 and a power noise receiver 750-22.

In an example embodiment, the (1-1)-th power noise information and the (2-1)-th power noise information may be identical or substantially identical to each other, and the (1-2)-th power noise information and the (2-2)-th power noise information may be identical or substantially identical to each other.

In an example embodiment, the (1-1)-th power noise information and the (2-1)-th power noise information may correspond to a first signal level of multi-level signaling that is performed between the memory controller 710*a* and the memory device 730*a*. The (1-2)-th power noise information and the (2-2)-th power noise information may correspond to a second signal level of the multi-level signaling.

Referring to FIGS. 10, 11A, and 11B, the (1-1)-th noise information generation circuit may include the power noise transmitter 710-11, and the power noise transmitter 710-11 may include a first resistor and a second resistor that are sequentially connected between a first power and a second power supplied to the memory controller 710*a*. The (1-2)-th noise information generation circuit may include the power noise transmitter 710-12, and the power noise transmitter 710-12 may include a third resistor and a fourth resistor that are sequentially connected between the first power and the second power. The (2-1)-th noise information generation circuit may include the power noise transmitter 710-21, and the power noise transmitter 710-21 may include a fifth resistor and a sixth resistor that are sequentially connected between the first power and the second power. The (2-2)-th noise information generation circuit may include the power noise transmitter 710-22, and the power noise transmitter 710-22 may include a seventh resistor and an eighth resistor that are sequentially connected between the first power and the second power.

In an example embodiment, first resistance values of the first resistor, the fourth resistor, the fifth resistor, and the eighth resistor may be identical or substantially identical to each other, and second resistance values of the second resistor, the third resistor, the sixth resistor, and the seventh resistor may be identical or substantially identical to each other. For example, as illustrated in FIG. 11B, a magnitude of each of the first resistance values may be "R1", and a magnitude of each of the second resistance values may be "R2".

In an example embodiment, as illustrated in FIG. 11B, each of the power noise transmitters 710-11, 710-12, 710-13, and 710-14 may adjust resistance values of resistors included therein, based on one of the control signals NCTL1 and NCTL2.

Figures 12A, 12B:
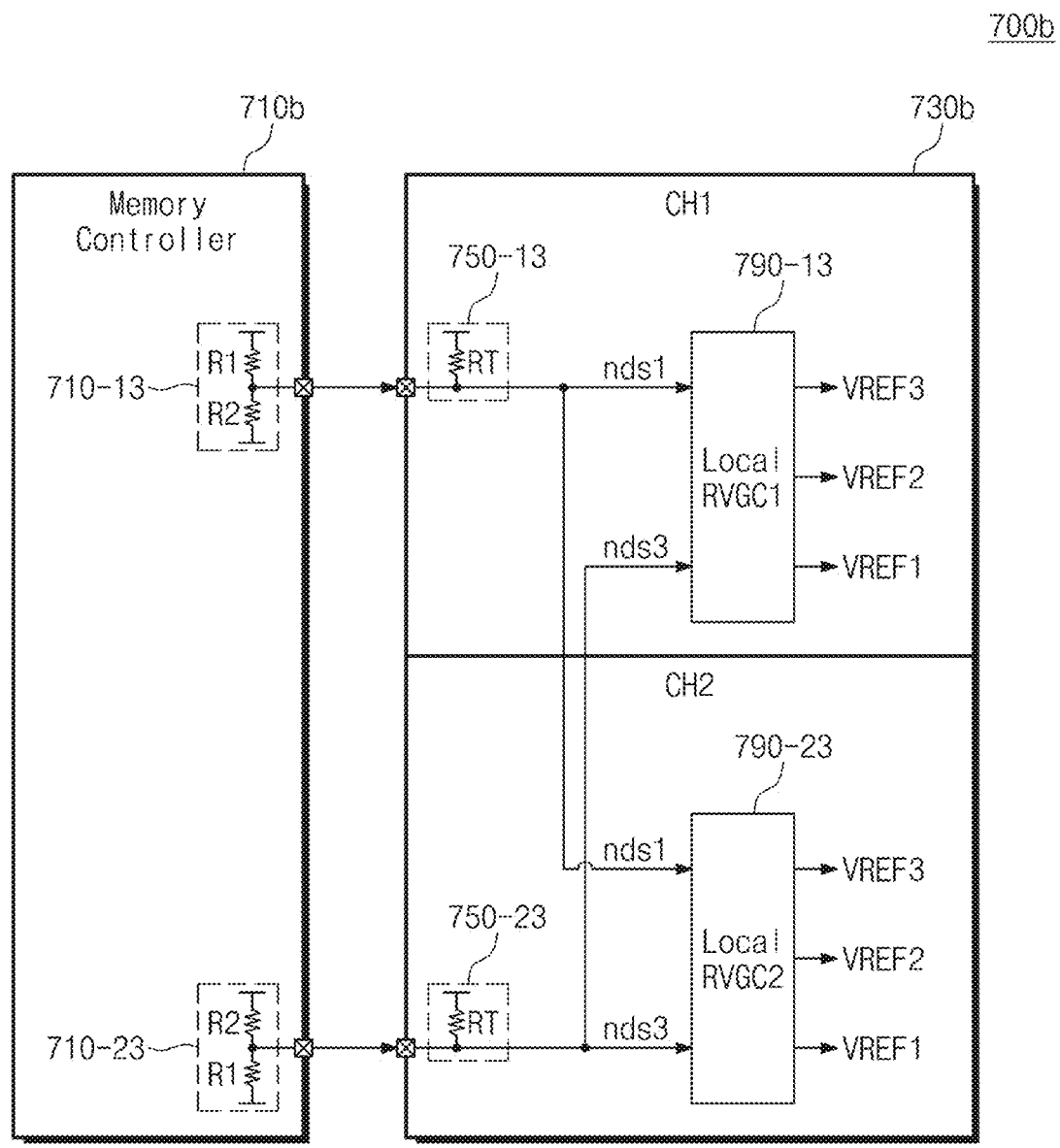
FIG. 12A is a block diagram illustrating an example embodiment of a memory system of FIG. 10.
FIG. 12B is a diagram for describing a power noise transmitter included in a reference voltage generation device of FIG. 12A.

FIG. 12A is a block diagram illustrating an example embodiment of a memory system of FIG. 10. FIG. 12B is a diagram for describing a power noise transmitter included in a reference voltage generation device of FIG. 12A.

Referring to FIGS. 10 and 12A, a memory system 700*b* may correspond to the memory system 10-1 of FIG. 10. The memory system 700*b* may include a memory controller 710*b* and a memory device 730*b*, the memory controller 710*b* may correspond to the memory controller 100-1 of FIG. 10, and the memory device 730*b* may correspond to the memory device 300-1 of FIG. 10.

The memory system 700*b* may include a plurality of channels and local reference voltage generation circuits corresponding to the plurality of channels. For example, the plurality of channels may include the first channel CH1 and the second channel CH2, and the local reference voltage generation circuits may include a third local reference voltage generation circuit 790-13 and a fourth local reference voltage generation circuit 790-23.

The third local reference voltage generation circuit 790-13 may receive third power noise information that corresponds to the first channel CH1 and includes the first noise signal nds1 from a third noise information generation circuit including a power noise transmitter 710-13 and a power noise receiver 750-13.

The fourth local reference voltage generation circuit 790-23 may receive fourth power noise information that corresponds to the second channel CH2 and includes the third noise signal nds3 from a fourth noise information generation circuit including a power noise transmitter 710-23 and a power noise receiver 750-23.

In an example embodiment, each of the third and fourth local reference voltage generation circuits may further receive power noise information from a noise information generation circuit corresponding to the other channel, not the corresponding channel. For example, the third local reference voltage generation circuit 790-13 may further receive the third power noise information including the third noise signal nds3 from the fourth noise information generation circuit, and the fourth local reference voltage generation circuit 790-23 may further receive the fourth power noise information including the first noise signal nds1 from the third noise information generation circuit.

In an example embodiment, the third power noise information and the fourth power noise information may be different from each other.

In an example embodiment, the third power noise information may correspond to a first signal level of multi-level signaling that is performed between the memory controller 710*b* and the memory device 730*b*. The fourth power noise information may correspond to a second signal level of the multi-level signaling.

Referring to FIGS. 10, 12A, and 12B, the third noise information generation circuit may include the power noise transmitter 710-13, and the power noise transmitter 710-13 may include a ninth resistor and a tenth resistor that are sequentially connected between a first power and a second power supplied to the memory controller 710b. The fourth noise information generation circuit may include the power noise transmitter 710-23, and the power noise transmitter 710-23 may include an eleventh resistor and a twelfth resistor that are sequentially connected between the first power and the second power.

In an example embodiment, resistance values of the ninth and twelfth resistors may be identical or substantially identical to each other, and resistance values of the tenth and eleventh resistors may be identical or substantially identical to each other. For example, as illustrated in FIG. 12B, a magnitude of each of the resistance values of the ninth resistor and the twelfth resistor may be "R1", and a magnitude of each of the resistance values of the tenth resistor and the eleventh resistor may be "R2".

In an example embodiment, as illustrated in FIG. 12B, each of the power noise transmitters 710-13 and 710-23 may adjust resistance values of resistors included therein, based on one of the control signals NCTL1 and NCTL2.

In an example embodiment, the third local reference voltage generation circuit 790-13 and the fourth local reference voltage generation circuit 790-23 may share the third power noise information and the fourth power noise information.

Figure 13A:
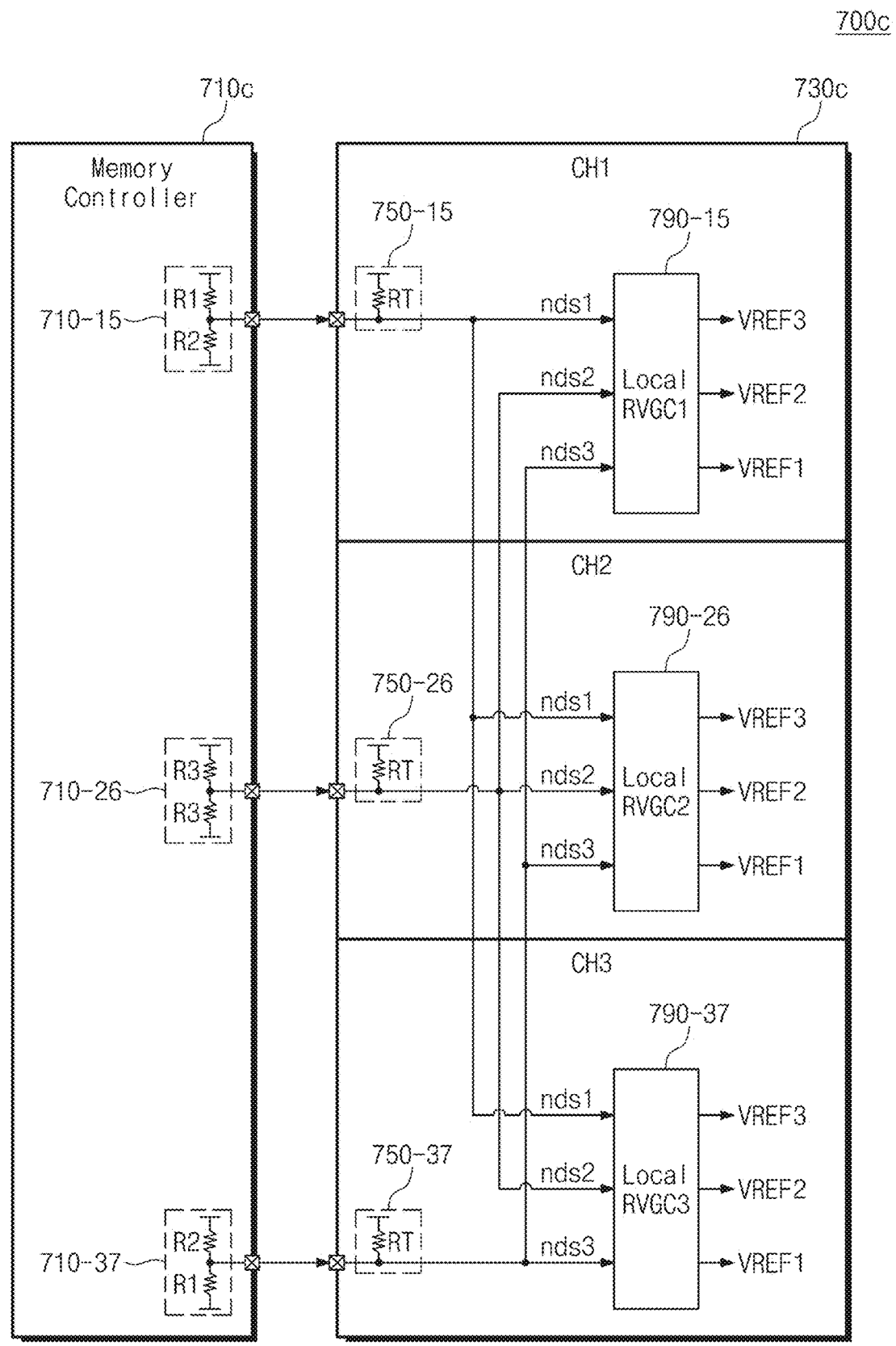
FIG. 13A is a block diagram illustrating an example embodiment of a memory system of FIG. 10.

FIG. 13A is a block diagram illustrating an example embodiment of a memory system of FIG. 10. FIG. 13B is a diagram for describing a power noise transmitter included in a reference voltage generation device of FIG. 13A.

Referring to FIGS. 10 and 13A, a memory system 700c may correspond to the memory system 10-1 of FIG. 10. The memory system 700c may include a memory controller 710c and a memory device 730c, the memory controller 710c may correspond to the memory controller 100-1 of FIG. 10, and the memory device 730c may correspond to the memory device 300-1 of FIG. 10.

The memory system 700c may include a plurality of channels and local reference voltage generation circuits corresponding to the plurality of channels. For example, the plurality of channels may include the first channel CH1, the second channel CH2, and the third channel CH3, and the local reference voltage generation circuits may include a fifth local reference voltage generation circuit 790-15, a sixth local reference voltage generation circuit 790-26, and a seventh local reference voltage generation circuit 790-37.

The fifth local reference voltage generation circuit 790-15 may receive fifth power noise information that corresponds to the first channel CH1 and includes the first noise signal nds1 from a fifth noise information generation circuit including a power noise transmitter 710-15 and a power noise receiver 750-15.

The sixth local reference voltage generation circuit 790-26 may receive sixth power noise information that corresponds to the second channel CH2 and includes the second noise signal nds2 from a sixth noise information generation circuit including a power noise transmitter 710-26 and a power noise receiver 750-26.

The seventh local reference voltage generation circuit 790-37 may receive seventh power noise information that corresponds to the third channel CH3 and includes the third noise signal nds3 from a seventh noise information generation circuit including a power noise transmitter 710-37 and a power noise receiver 750-37.

In an example embodiment, each of the fifth to seventh local reference voltage generation circuits may further receive power noise information from a noise information generation circuit corresponding to any other channel, not the corresponding channel. For example, the fifth local reference voltage generation circuit 790-15 may further receive the sixth power noise information including the second noise signal nds2 from the sixth noise information generation circuit and may further receive the seventh power noise information including the third noise signal nds3 from the seventh noise information generation circuit. The sixth local reference voltage generation circuit 790-26 may further receive the fifth power noise information including the first noise signal nds1 from the fifth noise information generation circuit and may further receive the seventh power noise information including the third noise signal nds3 from the seventh noise information generation circuit. The seventh local reference voltage generation circuit 790-37 may further receive the fifth power noise information including the first noise signal nds1 from the fifth noise information generation circuit and may further receive the sixth power noise information including the second noise signal nds2 from the sixth noise information generation circuit.

In an example embodiment, the fifth power noise information, the sixth power noise information, and the seventh power noise information may be different from each other.

In an example embodiment, the fifth power noise information may correspond to a first signal level of multi-level signaling that is performed between the memory controller 710c and the memory device 730c. The sixth power noise information may correspond to a second signal level of the multi-level signaling. The seventh power noise information may correspond to a third signal level of the multi-level signaling.

Referring to FIGS. 10, 13A, and 13B, the fifth noise information generation circuit may include the power noise transmitter 710-15, and the power noise transmitter 710-15 may include a 13rd resistor and a 14th resistor that are sequentially connected between a first power and a second power supplied to the memory controller 710c. The sixth noise information generation circuit may include the power noise transmitter 710-26, and the power noise transmitter 710-26 may include a 15th resistor and a 16th resistor that are sequentially connected between the first power and the second power. The seventh noise information generation circuit may include the power noise transmitter 710-37, and the power noise transmitter 710-37 may include a 17th resistor and a 18th resistor that are sequentially connected between the first power and the second power.

In an example embodiment, resistance values of the 13rd resistor and the 18th resistor may be identical or substantially identical to each other, resistance values of the 14th resistor and the 17th resistor may be identical or substantially identical to each other, and resistance values of the 15th resistor and the 16th resistor may be identical or substantially identical to each other. For example, as illustrated in FIG. 13B, a magnitude of each of the resistance values of the 13rd resistor and the 18th resistor may be "R1", a magnitude of each of the resistance values of the 14th resistor and the 17th resistor may be "R2", and a magnitude of each of the resistance values of the 15th resistor and the 16th resistor may be "R3".

In an example embodiment, as illustrated in FIG. 13B, each of the power noise transmitters 710-15, 710-26, and 710-37 may adjust resistance values of resistors included therein, based on one of the control signals NCTL1, NCTL2, and NCTL3.

In an example embodiment, the fifth local reference voltage generation circuit 790-15, the sixth local reference voltage generation circuit 790-26, and the seventh local reference voltage generation circuit 790-37 may share the fifth power noise information, the sixth power noise information, and the seventh power noise information.

In the example embodiments described with reference to FIGS. 11A, 11B, 12A, 12B, 13A, and 13B, local reference voltage generation circuits may respectively correspond to a plurality of channels, and each of the local reference voltage generation circuits may provide reference voltages to sub-memory devices associated with the corresponding one of the plurality of channels. However, the example embodiments are not limited thereto. In an example embodiment, the local reference voltage generation circuits may respectively correspond to a plurality of dies; in another example embodiment, the local reference voltage generation circuits may respectively correspond to a plurality of packages.

Figure 14:
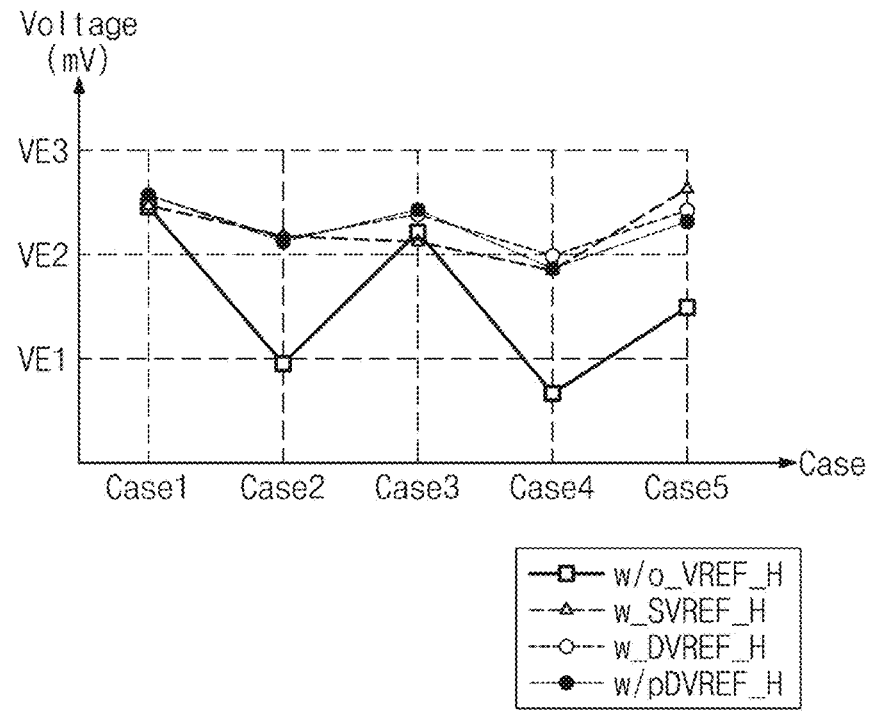
FIGS. 14, 15, and 16 are graphs illustrating results of performing simulation on a reference voltage generation device of FIG. 1.
Figure 15:
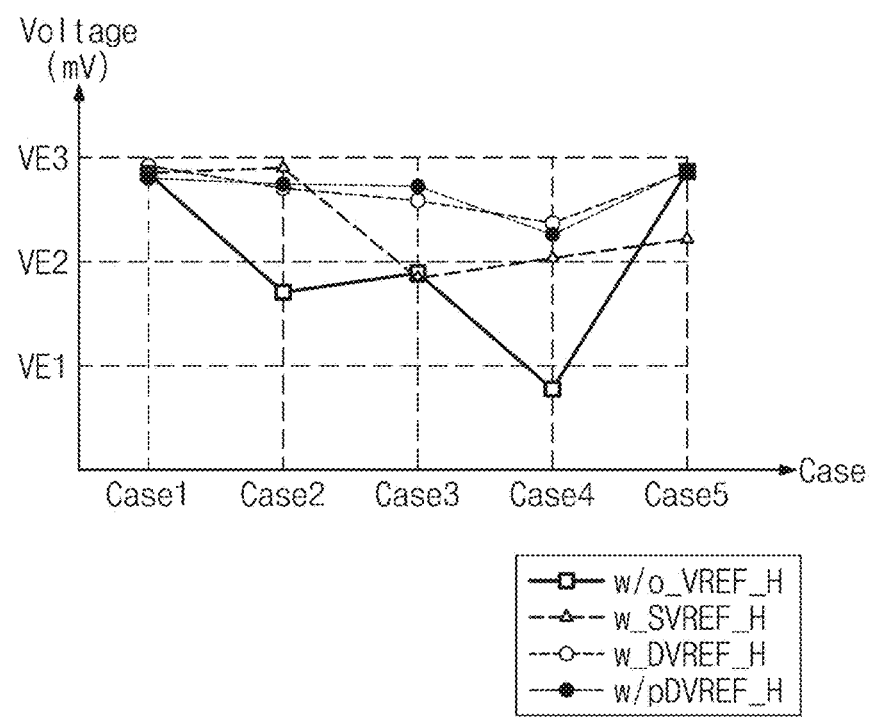
Figure 16:
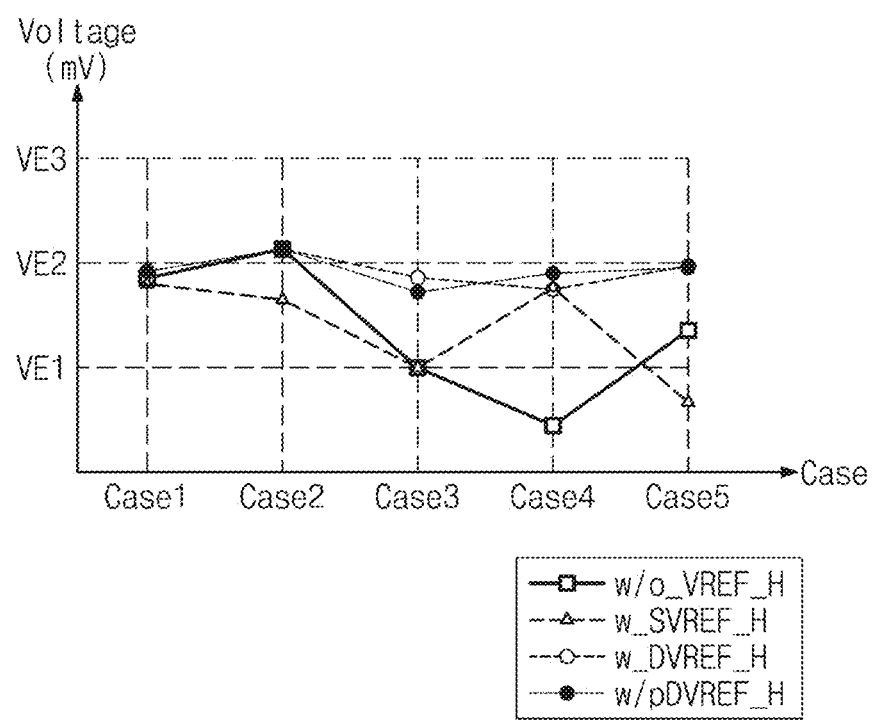

FIGS. 14, 15, and 16 are graphs illustrating results of performing simulation on a reference voltage generation device of FIG. 1.

In FIGS. 14, 15, and 16, Case 1 refers to a case of not generating both the first power noise pns1 and the second power noise pns2 described with reference to FIGS. 1, 7, and 8, Case2 refers to a case of generating only the first power noise pns1, and Case3 refers to a case of generating only the second power noise pns2. Case4 refers to a case of generating all the first and second power noises pns1 and pns2, with the first power noise pns1 and the second power noise pns2 being in phase, and Case5 refers to a case of generating all the first and second power noises pns1 and pns2, with the first power noise pns1 and the second power noise pns2 being out of phase.

In FIGS. 14, 15, and 16, there are illustrated results of measuring the eye heights EH3, EH2, EH1 through the simulation performed for each of the following cases: the case w/o_VREF_H where the power noise transmitter (e.g., 210*b*) described with reference to FIG. 7 does not include all the resistors RPU and RPD, the case w_SVREF_H where the power noise transmitter includes the resistor RPU and does not include the resistor RPD, the case w_DVREF_H where the power noise transmitter includes all the resistors RPU and RPD and is configured as illustrated in FIG. 11A, and the case w/p DVREF_H where the power noise transmitter includes all the resistors RPU and RPD and is configured as illustrated in FIG. 12A. FIG. 14 illustrates a result of measuring the eye height EH3, FIG. 15 illustrates a result of measuring the eye height EH2, and FIG. 16 illustrates a result of measuring the eye height EH1. That is, the "w/o_VREF_H" case corresponds to the case where all the first and second power noises are not removed from a signal transmitted to a memory device through a communication line after encoded by the PAM4 signaling scheme, and the "w_SVREF_H" case corresponds to the case where only the first power noise is removed from a signal transmitted to the memory device. The "w_DVREF_H" and "w/p DVREF_H" cases correspond to the case where the first and second power noises are removed from a signal transmitted to the memory device in different schemes.

It is confirmed from FIG. 14 that the eye heights EH3 corresponding to the "w_SVREF_H" case where only the first power noise is removed and the "w_DVREF_H" and "w/p DVREF_H" cases where all the first and second power noises are removed appear to be larger than that corresponding to the "w/o_VREF_H" case where all the first and second power noises are not removed.

It is confirmed from FIG. 15 that the eye height EH2 corresponding to the "w_SVREF_H" case where only the first power noise is removed appears to be larger than that corresponding to the "w/o_VREF_H" case where all the first and second power noises are not removed and that the eye heights EH2 corresponding to the "w_DVREF_H" and "w/p DVREF_H" cases where all the first and second power noises are removed appear to be larger than that corresponding to the "w_SVREF_H" case where only the first power noise is removed.

It is confirmed from FIG. 16 that the eye height EH1 corresponding to the c'w_SVREF_H" case where only the first power noise is removed appears to be larger than that corresponding to the "w/o_VREF_H" case where all the first and second power noises are not removed and the eye height EH1 corresponding to the "w_DVREF_H" and "w/p DVREF_H" cases where all the first and second power noises are removed appear to be larger than that corresponding to the "w_SVREF_H" case where only the first power noise is removed.

The eye height EH3 among the eye heights EH1, EH2, and EH3 may be more susceptible to the first power noise among the first power noise and the second power noise, and the eye height EH1 may be more susceptible to the second power noise. In the simulation of measuring the eye height EH3 (refer to FIG. 14), the "w_DVREF_H" and "w/p DVREF_H" cases where all the first and second power noises are removed may show a small performance difference, compared to the "w_SVREF_H" case where only the first power noise is removed; in the simulations of measuring the eye heights EH1 and EH2 (refer to FIGS. 15 and 16), the "w_DVREF_H" and "w/p DVREF_H" cases where all the first and second power noises are removed may show a significant performance difference, compared to the "w_SVREF_H" case where only the first power noise is removed.

Figure 17:
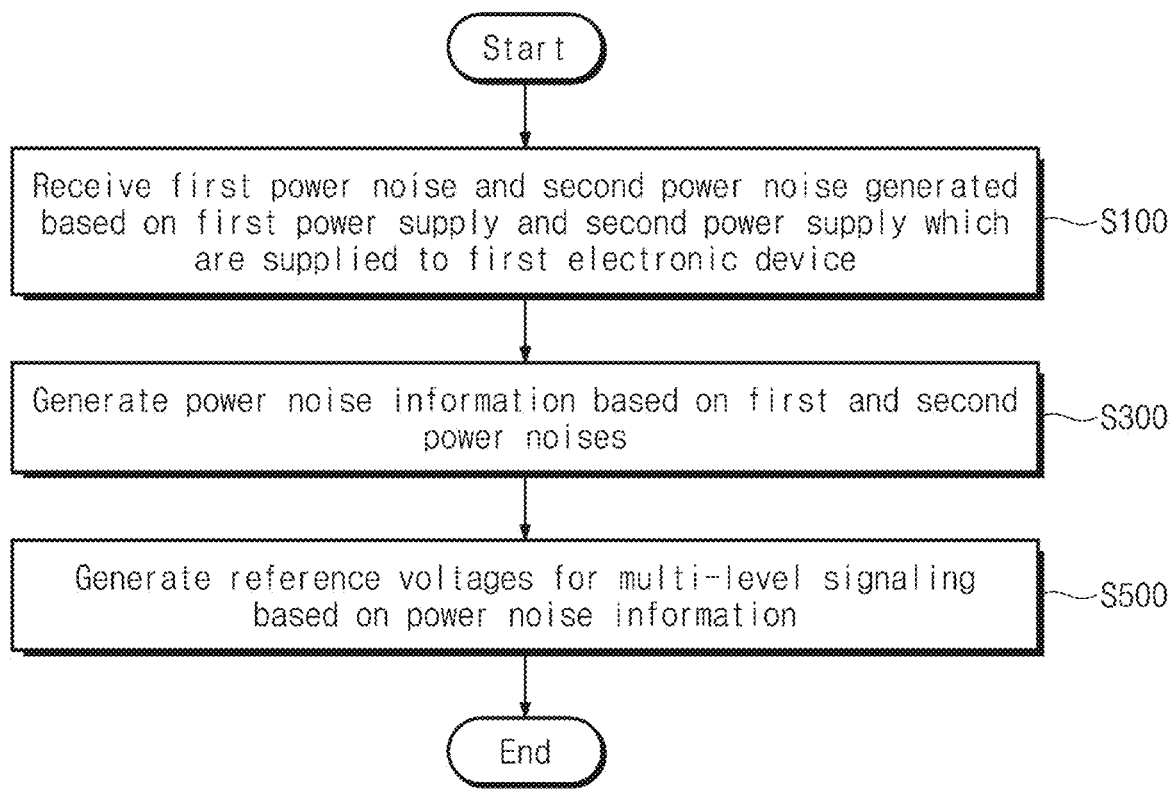
FIG. 17 is a flowchart illustrating a reference voltage generation method according to an example embodiment of the inventive concepts.

FIG. 17 is a flowchart illustrating a reference voltage generation method according to an example embodiment of the present disclosure.

Referring to FIG. 17, in the reference voltage generation method according to an example embodiment of the inventive concepts, a first power noise and a second power noise are received (S100).

In an example embodiment, the first power noise and the second power noise may be received from an external electronic device.

Power noise information is generated based on the first power noise and the second power noise (S300).

In an example embodiment, the first power noise may refer to a power noise that is generated based on a first power and is propagated through a communication line, and the second power noise may refer to a power noise that is generated based on a second power and is propagated through the communication line.

In an example embodiment, the first power and the second power may be powers that are supplied to the external electronic device.

In an example embodiment, operation S100 and operation S300 may be performed by a noise information generation device (e.g., 400 of FIG. 1).

Reference voltages for multi-level signaling are generated based on the power noise information (S500).

In an example embodiment, operation S500 may be performed by a reference voltage generation circuit (e.g., 310 of FIG. 1).

Figure 18:
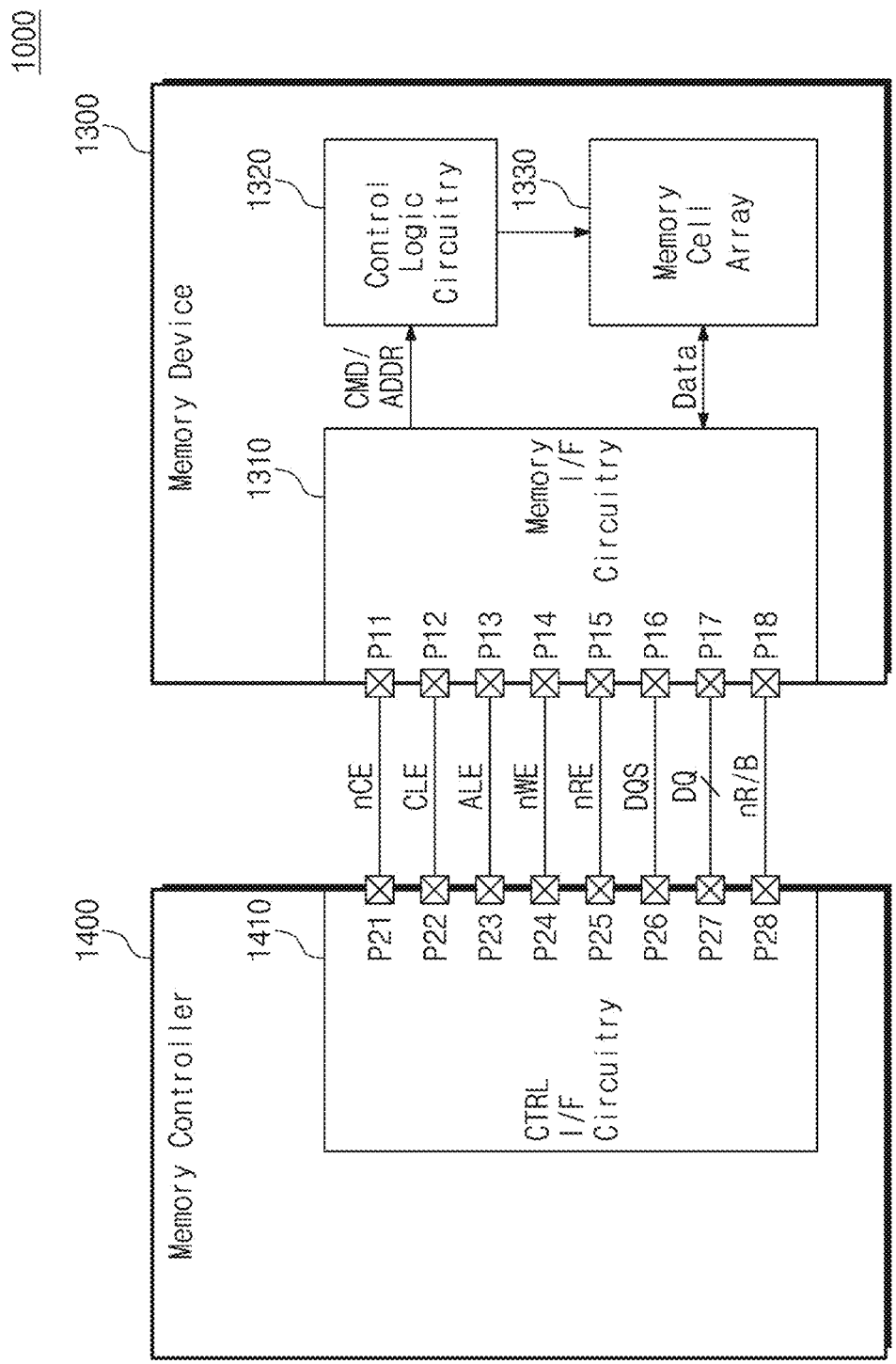
FIG. 18 is a block diagram illustrating a memory system according to an example embodiment of the inventive concepts.

FIG. 18 is a block diagram illustrating a memory system according to an example embodiment of the inventive concepts.

Referring to FIG. 18, a memory system 1000 may include a memory device 1300 and a memory controller 1400. The memory device 1300 may correspond to one of memory devices, which communicates with the memory controller 1400 based on one of the plurality of channels CH1 to CHz described with reference to FIG. 10. The memory controller 1400 may correspond to one of the first electronic devices 100 and 100*a* of FIGS. 1 and 2 or may correspond to one of the memory controllers 100*b*, 100-1, 710*a*, 710*b*, and 710*c* of FIGS. 3, 10, 11A, 12A, and 13A.

The memory device 1300 may include first to eighth pins P11 to P18, a memory interface circuitry 1310, a control logic circuitry 1320, and a memory cell array 1330.

The memory interface circuitry 1310 may receive a chip enable signal nCE from the memory controller 1400 through the first pin P11. The memory interface circuitry 1310 may transmit and receive signals to and from the memory controller 1400 through the second to eighth pins P12 to P18 in response to the chip enable signal nCE. For example, when the chip enable signal nCE is in an enable state (e.g., a low level), the memory interface circuitry 1310 may transmit and receive signals to and from the memory controller 1400 through the second to eighth pins P12 to P18.

The memory interface circuitry 1310 may receive a command latch enable signal CLE, an address latch enable signal ALE, and a write enable signal nWE from the memory controller 1400 through the second to fourth pins P12 to P14. The memory interface circuitry 1310 may receive a data signal DQ from the memory controller 1400 through the seventh pin P17 or transmit the data signal DQ to the memory controller 1400. A command CMD, an address ADDR, and data may be transmitted via the data signal DQ. For example, the data signal DQ may be transmitted through a plurality of data signal lines. In some example embodiments, the seventh pin P17 may include a plurality of pins respectively corresponding to a plurality of data signals DQ(s).

In an example embodiment, the data signal DQ may be a signal encoded by the multi-level signaling scheme described above with reference to FIG. 1. For example, the multi-level signaling scheme may be a PAM4 signaling scheme.

The memory interface circuitry 1310 may obtain the command CMD from the data signal DQ, which is received in an enable section (e.g., a high-level state) of the command latch enable signal CLE based on toggle time points of the write enable signal nWE. The memory interface circuitry 1310 may obtain the address ADDR from the data signal DQ, which is received in an enable section (e.g., a high-level state) of the address latch enable signal ALE based on the toggle time points of the write enable signal nWE.

In an example embodiment, the write enable signal nWE may be maintained at a static state (e.g., a high level or a low level) and toggle between the high level and the low level. For example, the write enable signal nWE may toggle in a section in which the command CMD or the address ADDR is transmitted. Thus, the memory interface circuitry 1310 may obtain the command CMD or the address ADDR based on toggle time points of the write enable signal nWE.

The memory interface circuitry 1310 may receive a read enable signal nRE from the memory controller 1400 through the fifth pin P15. The memory interface circuitry 1310 may receive a data strobe signal DQS from the memory controller 1400 through the sixth pin P16 or transmit the data strobe signal DQS to the memory controller 1400.

In a data (DATA) output operation of the memory device 1300, the memory interface circuitry 1310 may receive the read enable signal nRE, which toggles through the fifth pin P15, before outputting the data DATA. The memory interface circuitry 1310 may generate the data strobe signal DQS, which toggles based on the toggling of the read enable signal nRE. For example, the memory interface circuitry 1310 may generate a data strobe signal DQS, which starts toggling after a predetermined delay (e.g., tDQSRE), based on a toggling start time of the read enable signal nRE. The memory interface circuitry 1310 may transmit the data signal DQ including the data DATA based on a toggle time point of the data strobe signal DQS. Thus, the data DATA may be aligned with the toggle time point of the data strobe signal DQS and transmitted to the memory controller 1400.

In a data (DATA) input operation of the memory device 1300, when the data signal DQ including the data DATA is received from the memory controller 1400, the memory interface circuitry 1310 may receive the data strobe signal DQS, which toggles, along with the data DATA from the memory controller 1400. The memory interface circuitry 1310 may obtain the data DATA from the data signal DQ based on toggle time points of the data strobe signal DQS. For example, the memory interface circuitry 1310 may sample the data signal DQ at rising and falling edges of the data strobe signal DQS and obtain the data DATA.

The memory interface circuitry 1310 may transmit a ready/busy output signal nR/B to the memory controller 1400 through the eighth pin P18. The memory interface circuitry 1310 may transmit state information of the memory device 1300 through the ready/busy output signal nR/B to the memory controller 1400. When the memory device 1300 is in a busy state (e.g., when operations are being performed in the memory device 1300), the memory interface circuitry 1310 may transmit a ready/busy output signal nR/B indicating the busy state to the memory controller 1400. When the memory device 1300 is in a ready state (e.g., when operations are not performed or completed in the memory device 1300), the memory interface circuitry 1310 may transmit a ready/busy output signal nR/B indicating the ready state to the memory controller 1400. For example, while the memory device 1300 is reading data DATA from the memory cell array 1330 in response to a page read command, the memory interface circuitry 1310 may transmit a ready/busy output signal nR/B indicating a busy state (e.g., a low level) to the memory controller 1400. For example, while the memory device 1300 is programming data DATA to the memory cell array 1330 in response to a program command, the memory interface circuitry 1310 may transmit a ready/busy output signal nR/B indicating the busy state to the memory controller 1400.

The control logic circuitry 1320 may control all operations of the memory device 1300. The control logic circuitry 1320 may receive the command/address CMD/ADDR obtained from the memory interface circuitry 1310. The control logic circuitry 1320 may generate control signals for controlling other components of the memory device 1300 in response to the received command/address CMD/ADDR. For example, the control logic circuitry 1320 may generate various control signals for programming data DATA to the memory cell array 1330 or reading the data DATA from the memory cell array 1330. For example, the control logic circuitry 1320 may further generate the control signal NCTL described above with reference to FIG. 1.

The memory cell array 1330 may store the data DATA obtained from the memory interface circuitry 1310, via the control of the control logic circuitry 1320. The memory cell array 1330 may output the stored data DATA to the memory interface circuitry 1310 via the control of the control logic circuitry 1320.

The memory cell array 1330 may include a plurality of memory cells. For example, the plurality of memory cells may be flash memory cells. However, the example embodiments are not limited thereto, and the memory cells may be RRAM cells, FRAM cells, PRAM cells, thyristor RAM (TRAM) cells, or MRAM cells. Hereinafter, an example embodiment in which the memory cells are NAND flash memory cells will mainly be described.

The memory controller 1400 may include first to eighth pins P21 to P28 and a controller interface circuitry 1410. The first to eighth pins P21 to P28 may respectively correspond to the first to eighth pins P11 to P18 of the memory device 1300.

The controller interface circuitry 1410 may transmit a chip enable signal nCE to the memory device 300 through the first pin P21. The controller interface circuitry 1410 may transmit and receive signals to and from the memory device 1300, which is selected by the chip enable signal nCE, through the second to eighth pins P22 to P28.

The controller interface circuitry 1410 may transmit the command latch enable signal CLE, the address latch enable signal ALE, and the write enable signal nWE to the memory device 1300 through the second to fourth pins P22 to P24. The controller interface circuitry 1410 may transmit or receive the data signal DQ to and from the memory device 1300 through the seventh pin P27.

The controller interface circuitry 1410 may transmit the data signal DQ including the command CMD or the address ADDR to the memory device 1300 along with the write enable signal nWE, which toggles. The controller interface circuitry 1410 may transmit the data signal DQ including the command CMD to the memory device 1300 by transmitting a command latch enable signal CLE having an enable state. Also, the controller interface circuitry 1410 may transmit the data signal DQ including the address ADDR to the memory device 1300 by transmitting an address latch enable signal ALE having an enable state.

The controller interface circuitry 1410 may transmit the read enable signal nRE to the memory device 1300 through the fifth pin P25. The controller interface circuitry 1410 may receive or transmit the data strobe signal DQS from or to the memory device 1300 through the sixth pin P26.

In a data (DATA) output operation of the memory device 1300, the controller interface circuitry 410 may generate a read enable signal nRE, which toggles, and transmit the read enable signal nRE to the memory device 1300. For example, before outputting data DATA, the controller interface circuitry 1410 may generate a read enable signal nRE, which is changed from a static state (e.g., a high level or a low level) to a toggling state. Thus, the memory device 1300 may generate a data strobe signal DQS, which toggles, based on the read enable signal nRE. The controller interface circuitry 1410 may receive the data signal DQ including the data DATA along with the data strobe signal DQS, which toggles, from the memory device 1300. The controller interface circuitry 1410 may obtain the data DATA from the data signal DQ based on a toggle time point of the data strobe signal DQS.

In a data (DATA) input operation of the memory device 1300, the controller interface circuitry 1410 may generate a data strobe signal DQS, which toggles. For example, before transmitting data DATA, the controller interface circuitry 1410 may generate a data strobe signal DQS, which is changed from a static state (e.g., a high level or a low level) to a toggling state. The controller interface circuitry 1410 may transmit the data signal DQ including the data DATA to the memory device 1300 based on toggle time points of the data strobe signal DQS.

The controller interface circuitry 1410 may receive a ready/busy output signal nR/B from the memory device 1300 through the eighth pin P28. The controller interface circuitry 1410 may determine state information of the memory device 1300 based on the ready/busy output signal nR/B.

As described above, a reference voltage generation device and a memory system according to some example embodiments of the inventive concepts may generate power noise information based on power noises that are generated based on both a first power and a second power supplied to an external electronic device and are propagated through a communication line. In the case of decoding multi-level signals, reference voltages may be generated based on the power noise information, and all the power noises that are based on both the first power and the second power may be removed based on the reference voltages. This may mean that the decoding error is inhibited or prevented.

The reference voltage generation device and the memory system according to some example embodiments of the inventive concepts may generate the power noise information without the addition of separate pins/pads.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While the inventive concepts have been described with reference to example embodiments thereof, it will be apparent to those of ordinary skill in the art that various changes and modifications may be made thereto without departing from the scope of the example embodiments.

What is claimed is:

1. A reference voltage generation device comprising:
a noise information generation circuit configured to generate power noise information based on a first power noise and a second power noise, the first power noise and the second power noise generated based on a first power and a second power supplied to a first electronic device and propagated from the first electronic device to a second electronic device through a communication line, the first electronic device and the second electronic device configured to perform data communication using a multi-level signaling scheme; and
a reference voltage generation circuit configured to generate three or more reference voltages for the multi-level signaling scheme based on the power noise information, the second electronic device configured to use the three or more reference voltages,
wherein the noise information generation circuit includes a power noise transmitter electrically connected with the first power, the second power and a first terminal, and configured to output the first power noise and the second power noise to the first terminal.

2. The reference voltage generation device of claim 1, wherein the noise information generation circuit includes:
a power noise receiver included in the second electronic device, the power noise receiver configured to receive the first and second power noises through a second terminal, the second terminal connected with the first terminal through the communication line.

3. The reference voltage generation device of claim 2, wherein
the power noise receiver is electrically connected with the first power and the second terminal.

4. The reference voltage generation device of claim 2, wherein
the power noise transmitter includes a first resistor and a second resistor connected in series between the first power and the second power, and
the power noise receiver includes a third resistor electrically connected between the first power and the second terminal.

5. The reference voltage generation device of claim 4, wherein
the first terminal is connected with a first node, and
the first node is between the first resistor and the second resistor.

6. The reference voltage generation device of claim 4, wherein,
when the first resistor has a first resistance value and the second resistor has a second resistance value, the power noise receiver is configured to output a first noise signal,
wherein, when each of the first resistor and the second resistor has a third resistance value, the power noise receiver is configured to output a second noise signal, and
wherein, when the first resistor has the second resistance value and the second resistor has the first resistance value, the power noise receiver is configured to output a third noise signal.

7. The reference voltage generation device of claim 6, wherein the power noise information includes the first noise signal, the second noise signal, and the third noise signal.

8. The reference voltage generation device of claim 6, wherein the reference voltage generation circuit includes:
a voltage generator configured to output a first voltage, a second voltage, and a third voltage;
a first adder configured to output a value obtained by adding the first voltage and the first noise signal as a first reference voltage;
a second adder configured to output a value obtained by adding the second voltage and the second noise signal as a second reference voltage; and
a third adder configured to output a value obtained by adding the third voltage and the third noise signal as a third reference voltage.

9. The reference voltage generation device of claim 6, wherein the reference voltage generation circuit includes:
a voltage generator configured to output a first voltage, a second voltage, and a third voltage;
a first adder configured to output a value obtained by adding the first voltage and the first noise signal as a first reference voltage;
a second adder configured to output a value obtained by adding the first noise signal and the third noise signal;
a first multiplier configured to output a value obtained by multiplying a ratio and a value output from the second adder;
a third adder configured to output a value obtained by adding the second voltage and a value output from the first multiplier as a second reference voltage; and
a fourth adder configured to output a value obtained by adding the third voltage and the third noise signal as a third reference voltage.

10. The reference voltage generation device of claim 1, wherein the multi-level signaling scheme is a pulse amplitude modulation level-4 (PAM4) scheme.

11. A memory system comprising:
a memory controller; and
a memory device connected with the memory controller through a plurality of channels, wherein the memory device includes local reference voltage generation circuits corresponding to the plurality of channels, and wherein each of the local reference voltage generation circuits is configured to
generate power noise information based on a first power noise and a second power noise, the first power noise and the second power noise generated based on a first power and a second power supplied to the memory controller and propagated from the memory controller to the memory device through a communication line; and
generate three or more reference voltages for multi-level signaling based on the power noise information,
wherein the multi-level signaling includes a pulse amplitude modulation level-4 (PAM4) scheme.

12. The memory system of claim 11, wherein
the plurality of channels include a first channel and a second channel,
the local reference voltage generation circuits include a first local reference voltage generation circuit and a second local reference voltage generation circuit, and
the first local reference voltage generation circuit is configured to receive first power noise information from a first noise information generation circuit corresponding to the first channel, and receive second power noise information from a second noise information generation circuit corresponding to the first channel, and
the second local reference voltage generation circuit is configured to receive third power noise information from a third noise information generation circuit corresponding to the second channel, and receive fourth power noise information from a fourth noise information generation circuit corresponding to the second channel.

13. The memory system of claim 12, wherein
the first power noise information and the third power noise information are identical to each other, and
the second power noise information and the fourth power noise information are identical to each other.

14. The memory system of claim 13, wherein
the first power noise information and the third power noise information correspond to a first signal level of the multi-level signaling, and
the second power noise information and the fourth power noise information correspond to a second signal level of the multi-level signaling.

15. The memory system of claim 12, wherein
the first noise information generation circuit includes a first resistor and a second resistor connected sequentially in series between the first power and the second power supplied to the memory controller, the second noise information generation circuit includes a third resistor and a fourth resistor connected sequentially in series between the first power and the second power supplied to the memory controller, the third noise information generation circuit includes a fifth resistor and a sixth resistor connected sequentially in series between the first power and the second power supplied to the memory controller, wherein the fourth noise information generation circuit includes a seventh resistor and an eighth resistor connected sequentially in series between the first power and the second power supplied to the memory controller, resistance values of the first resistor, the fourth resistor, the fifth resistor, and the eighth resistor are identical to each other, and resistance values of the second resistor, the third resistor, the sixth resistor, and the seventh resistor are identical to each other.

16. The memory system of claim 11, wherein the plurality of channels include a first channel and a second channel, the local reference voltage generation circuits include a first local reference voltage generation circuit and a second local reference voltage generation circuit, the first local reference voltage generation circuit is configured to receive first power noise information from a first noise information generation circuit corresponding to the first channel, and receive second power noise information from a second noise information generation circuit corresponding to the first channel, and the second local reference voltage generation circuit is configured to receive the second power noise information from the second noise information generation circuit corresponding to the second channel, and receive the first power noise information from the first noise information generation circuit corresponding to the first channel.

17. The memory system of claim 16, wherein the first power noise information and the second power noise information are different from each other.

18. The memory system of claim 17, wherein the first power noise information corresponds to a first signal level of the multi-level signaling, and the second power noise information corresponds to a second signal level of the multi-level signaling.

19. The memory system of claim 16, wherein the first noise information generation circuit includes a first resistor and a second resistor connected sequentially in series between the first power and the second power supplied to the memory controller, the second noise information generation circuit includes a third resistor and a fourth resistor connected sequentially in series between the first power and the second power supplied to the memory controller, resistance values of the first resistor and the fourth resistor are identical to each other, and resistance values of the second resistor and the third resistor are identical to each other.

20. A reference voltage generation device comprising:

a noise information generation circuit including a power noise transmitter and a power noise receiver, the power noise transmitter included in a first electronic device, and the power noise receiver included in a second electronic device; and a reference voltage generation circuit configured to generate three or more reference voltages used in the second electronic device, the first electronic device and the second electronic device configured to perform data communication using a multi-level signaling scheme, wherein the noise information generation circuit is configured to generate power noise information based on a first power noise and a second power noise, and the first power noise and the second power noise are generated based on a first power and a second power supplied to the first electronic device and propagated from the first electronic device to the second electronic device through a communication line, the reference voltage generation circuit is configured to generate the three or more reference voltages for the multi-level signaling scheme based on the power noise information, the power noise transmitter is configured to output the first and second power noises to a first terminal, the power noise receiver is configured to receive the first and second power noises through a second terminal, the second terminal connected with the first terminal through the communication line, and the multi-level signaling scheme is a pulse amplitude modulation level-4 (PAM4) scheme.

* * * * *